(12) United States Patent
Kuma et al.

(10) Patent No.: US 8,076,839 B2
(45) Date of Patent: Dec. 13, 2011

(54) ORGANIC ELECTROLUMINESCENCE DEVICE

(75) Inventors: Hitoshi Kuma, Sodegaura (JP); Hiroshi Yamamoto, Sodegaura (JP); Chishio Hosokawa, Sodegaura (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 396 days.

(21) Appl. No.: 12/300,345

(22) PCT Filed: May 2, 2007

(86) PCT No.: PCT/JP2007/059364
§ 371 (c)(1),
(2), (4) Date: Nov. 11, 2008

(87) PCT Pub. No.: WO2007/132678
PCT Pub. Date: Nov. 22, 2007

(65) Prior Publication Data
US 2009/0179554 A1    Jul. 16, 2009

(30) Foreign Application Priority Data
May 11, 2006 (JP) .................................. 2006-133033

(51) Int. Cl.
*H01J 1/63*    (2006.01)

(52) U.S. Cl. ...................................... 313/504; 428/690

(58) Field of Classification Search .................. 428/690, 428/917, 411.1, 336; 313/502–509; 257/40, 257/88, 104, E51; 532/1; 540/1
See application file for complete search history.

(56) References Cited

U.S. PATENT DOCUMENTS

| | | | |
|---|---|---|---|
| 6,171,715 B1 | 1/2001 | Sato et al. | |
| 7,358,661 B2 | 4/2008 | Kuma | |
| 2006/0147747 A1 | 7/2006 | Yamamoto et al. | |
| 2006/0220538 A1 | 10/2006 | Kuma | |
| 2007/0007882 A1 | 1/2007 | Fukuoka et al. | |
| 2007/0108894 A1 | 5/2007 | Hosokawa et al. | |
| 2007/0200490 A1* | 8/2007 | Kawamura et al. | 313/504 |
| 2008/0164811 A1 | 7/2008 | Kuma | |

FOREIGN PATENT DOCUMENTS

| | | |
|---|---|---|
| CN | 1453654 A | 11/2003 |
| EP | 1 602 648 A1 | 12/2005 |
| JP | 6-176870 | 6/1994 |
| JP | 11-312584 | 11/1999 |
| JP | 11-312585 | 11/1999 |

(Continued)

OTHER PUBLICATIONS

Machine English translation JP 2006-066380 A. Feb. 4, 2011.*

(Continued)

*Primary Examiner* — Angela Ortiz
*Assistant Examiner* — J. L. Yang
(74) *Attorney, Agent, or Firm* — Oblon, Spivak, McClelland, Maier & Neustadt, L.L.P.

(57) ABSTRACT

An organic electroluminescence device (1) including: an anode (20) and a cathode (50), at least two organic emitting layers (30), (32) and (34) interposed between the anode and the cathode, and at least one intermediate connection layer (40) and (42) being provided between the organic emitting layers (30), (32) and (34), the intermediate connection layer (40) and (42) comprising an acceptor layer, a donor layer and an electron-transporting material layer being stacked in this order from the cathode (50), the electron-transporting material layer containing a non-complex compound with a nitrogen-containing heterocyclic structure.

20 Claims, 1 Drawing Sheet

FOREIGN PATENT DOCUMENTS

| | | |
|---|---|---|
| JP | 2000-113985 | 4/2000 |
| JP | 2001-288172 | 10/2001 |
| JP | 2002-047274 | 2/2002 |
| JP | 2003-45676 | 2/2003 |
| JP | 2006-49396 | 2/2006 |
| JP | 2006-66380 | 3/2006 |
| JP | 2006066380 A * | 3/2006 |
| WO | WO 03/060956 A2 | 7/2003 |
| WO | WO 2004/080975 A1 | 9/2004 |
| WO | WO 2004/095892 A1 | 11/2004 |
| WO | WO 2005/097756 A1 * | 4/2005 |
| WO | WO 2005/097756 A1 | 10/2005 |

OTHER PUBLICATIONS

U.S. Appl. No. 12/300,132, filed Nov. 10, 2008, Kuma, et al.
U.S. Appl. No. 12/297,520, filed Oct. 17, 2008, Fukuoka, et al.
U.S. Appl. No. 11/913,272, filed Oct. 31, 2007, Tomai, et al.
Extended European Search Report issued Oct. 29, 2010, in Patent Application No. 07742799.5
Office Action issued Jul. 5, 2011, in China Patent Application No. 200780017094.1.

* cited by examiner

ORGANIC ELECTROLUMINESCENCE DEVICE

This application is a 371 of PCT/JP2007/059364, filed May 2, 2007.

TECHNICAL FIELD

The invention relates to an organic electroluminescence (EL) device.

BACKGROUND

An EL device utilizing electroluminescence has a high degree of visibility due to the self-emitting nature thereof. In addition, being a perfect solid device, it has benefits such as excellent impact resistance. For these reasons, use of an EL device as an emitting device in various displays has attracted attention.

The EL device is divided into an inorganic EL device using an inorganic compound as an emitting material, and an organic EL device using an organic compound as an emitting material. Of these, an organic EL device has been developed as the next-generation emitting device, since it can significantly reduce an applied voltage, can easily attain full-color display, consumes only a small amount of power and is capable of performing plane emission.

Although an organic EL device basically comprises an anode, an organic emitting layer and a cathode being stacked in this order, various device configurations are studied with the aim of developing an organic EL device having a high efficiency and a long life.

In order to enhance the efficiency and prolong the life, a technology has been disclosed in which a plurality of units are stacked, with each unit consisting of a cathode, an organic emitting layer and an anode being stacked in this order (see Patent Documents 1 to 3, for example). As compared with a single-layer device, this organic EL device can have a prolonged life, since only a lower current density is required to obtain a luminance which is equivalent to that attained by the single-layer device. However, the above-mentioned technologies have such a disadvantage that a driving voltage is significantly increased, since a plurality of devices is stacked in series.

Patent Document 1: JP-A-06-176870
Patent Document 2: JP-A-11-312584
Patent Document 3: JP-A-11-312585

The invention has been made in view of the above-mentioned problems, and the object thereof is to provide an organic EL device which has a high degree of efficiency and can be operated at a low driving voltage even though a plurality of emitting layers are stacked in series.

DISCLOSURE OF THE INVENTION

According to the invention, the following organic EL device can be provided.

1. An organic electroluminescence device comprising:
   an anode and a cathode,
   at least two organic emitting layers interposed between the anode and the cathode, and
   at least one intermediate connection layer being provided between the organic emitting layers,
   the intermediate connection layer comprising an acceptor layer, a donor layer and an electron-transporting material layer being stacked in this order from the cathode, the electron-transporting material layer containing a non-complex compound with a nitrogen-containing heterocyclic structure.

2. The organic electroluminescence device according to 1, wherein the nitrogen-containing heterocyclic structure is a nitrogen-containing five-membered heterocyclic structure.

3. The organic electroluminescence device according to 1, wherein the non-complex compound with a nitrogen-containing heterocyclic structure in the electron-transporting material layer is a compound represented by the following formula (1)

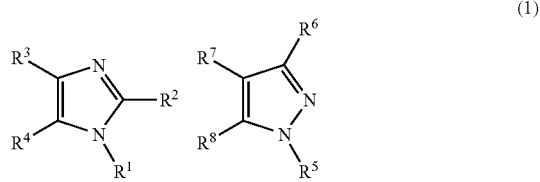

wherein $R^1$ to $R^8$ are independently a hydrogen atom, a substituted or unsubstituted aryl group having 5 to 60 atoms that form a ring (ring atoms), a substituted or unsubstituted heteroaryl group having 5 to 60 ring atoms, a substituted or unsubstituted alkyl group having 1 to 50 carbon atoms, a substituted or unsubstituted cycloalkyl group having 3 to 50 carbon atoms, a substituted or unsubstituted aralkyl group having 6 to 50 ring atoms, a substituted or unsubstituted alkoxy group having 1 to 50 carbon atoms, a substituted or unsubstituted aryloxy group having 5 to 50 ring atoms, a substituted or unsubstituted arylthio group having 5 to 50 ring atoms, a substituted or unsubstituted alkoxycarbonyl group having 1 to 50 carbon atoms, an amino group substituted by a substituted or unsubstituted aryl group having 5 to 50 ring atoms, a halogen atom, a cyano group, a nitro group, a hydroxy group or a carboxy group; and a pair of adjacent substituents of $R^1$ to $R^8$ may be bonded to each other to form an aromatic ring or a heterocyclic ring.

4. The organic electroluminescence device according to 1, wherein the non-complex compound with a nitrogen-containing heterocyclic structure in the electron-transporting material layer is a compound represented by the following formula (2):

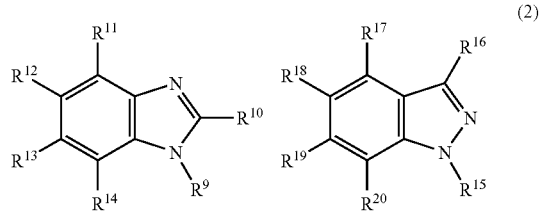

wherein $R^9$ to $R^{20}$ are independently a hydrogen atom, a substituted or unsubstituted aryl group having 5 to 60 ring atoms, a substituted or unsubstituted heteroaryl group having 5 to 60 ring atoms, a substituted or unsubstituted alkyl group having 1 to 50 carbon atoms, a substituted or unsubstituted cycloalkyl group having 3 to 50 carbon atoms, a substituted or unsubstituted aralkyl group having 6 to 50 ring atoms, a substituted or unsubstituted alkoxy group having 1 to 50 carbon atoms, a substituted or unsubstituted aryloxy group having 5 to 50 ring atoms, a substituted or unsubstituted arylthio group having 5 to 50 ring atoms, a substituted or unsubstituted alkoxycarbonyl group having 1 to 50 carbon atoms, an amino group substituted by a substituted or unsubstituted aryl group having 5 to 50 ring atoms, a halogen atom, a cyano group, a nitro group, a hydroxy group or a carboxy group; adjacent groups of $R^9$ to $R^{20}$ may be bonded to each other to form an aromatic ring, and at least one of $R^9$ to $R^{20}$ is a substituent represented by the following formula:

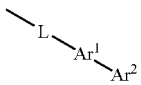

wherein L is a substituted or unsubstituted arylene group having 6 to 60 carbon atoms, a substituted or unsubstituted heteroarylene group having 5 to 60 carbon atoms or a substituted or unsubstituted fluorenylene group;

$Ar^1$ is a substituted or unsubstituted arylene group having 6 to 60 carbon atoms, a substituted or unsubstituted pyridinylene group or a substituted or unsubstituted quinolinylene group;

$Ar^2$ is a hydrogen atom, a substituted or unsubstituted aryl group having 5 to 60 ring atoms, a substituted or unsubstituted pyridyl group, a substituted or unsubstituted quinolyl group, a substituted or unsubstituted alkyl group having 1 to 50 carbon atoms, a substituted or unsubstituted cycloalkyl group having 3 to 50 carbon atoms, a substituted or unsubstituted aralkyl group having 6 to 50 ring atoms, a substituted or unsubstituted alkoxy group having 1 to 50 carbon atoms, a substituted or unsubstituted aryloxy group having 5 to 50 ring atoms, a substituted or unsubstituted arylthio group having 5 to 50 ring atoms, a substituted or unsubstituted alkoxycarbonyl group having 1 to 50 carbon atoms, an amino group substituted by a substituted or unsubstituted aryl group having 5 to 50 ring atoms, a halogen atom, a cyano group, a nitro group, a hydroxy group or a carboxy group.

5. The organic electroluminescence device according to 4, wherein the non-complex compound with a nitrogen-containing heterocyclic structure in the electron-transporting material layer is a compound represented by the following formula:

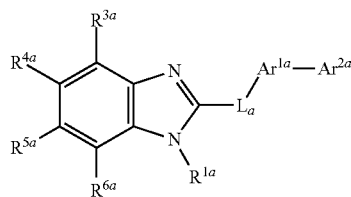

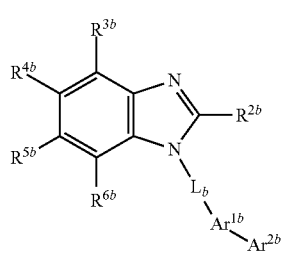

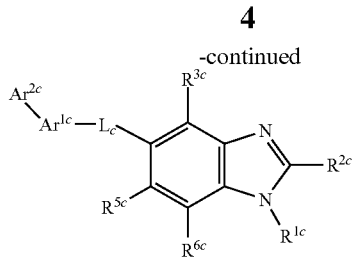

wherein $R^{1a}$ to $R^{6c}$, $L_a$ to $L_c$ and $Ar^{1a}$ to $Ar^{2c}$ are the same as $R^9$ to $R^{20}$, L, $Ar^1$ and $Ar^2$ in the above formula (2), respectively.

6. The organic electroluminescence device according to any one of 1 to 5, wherein the donor of the donor layer is an alkaline metal, an alkaline earth metal, a rare earth metal, an oxide of an alkali metal, a halide of an alkali metal, an oxide of an alkaline earth metal, a halide of an alkaline earth metal, an oxide of a rare earth metal, a halide of a rare earth metal, an organic complex of an alkali metal, an organic complex of an alkaline earth metal and an organic complex of a rare earth metal.

7. The organic electroluminescence device according to any one of 1 to 6, wherein the acceptor of the acceptor layer is an organic compound having an electron-attracting substituent or an electron-deficient ring.

8. The organic electroluminescence device according to 7, wherein the acceptor in the acceptor layer is a quinoide derivative, an arylborane derivative, a thiopyrane dioxide derivative, a naphthalimide derivative or a hexaazatriphenylene derivative.

According to the invention, an organic EL device which has a high degree of efficiency and can be operated at a low driving voltage, and which is obtained by stacking a plurality of emitting layers, can be provided.

BEST MODE FOR CARRYING OUT THE INVENTION

In the organic EL device of the invention, at least two organic emitting layers are interposed between an anode and a cathode, and at least one intermediate connection layer is provided between the organic emitting layers.

The intermediate connection layer comprises an acceptor layer, a donor layer and an electron-transporting material layer stacked in this order from the cathode. The electron-transporting material layer contains a non-complex compound with a nitrogen-containing heterocyclic structure.

Figure 1:
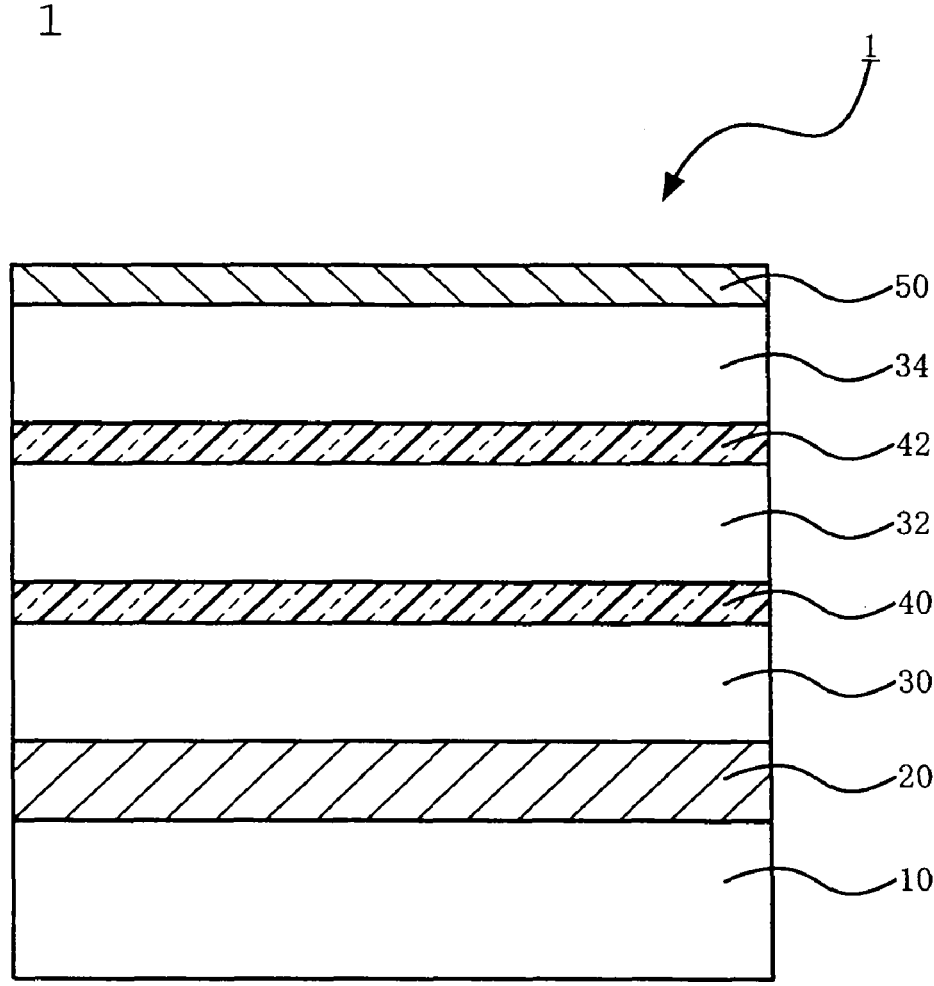
FIG. 1 is a view showing a first embodiment of the organic EL device of the invention.

FIG. 1 is a view showing one embodiment of the organic EL device of the invention. This organic EL device has three organic emitting layers being stacked.

In this organic EL device 1, a transparent anode 20 is provided on a supporting substrate 10. A cathode 50 is provided in such a manner that it is opposed to the transparent anode 20. Between the transparent anode 20 and the cathode 50, a first organic emitting layer 30, a second organic emitting layer 32, a third organic emitting layer 34, a first intermediate connection layer 40 and a second intermediate connection layer 42 are provided. The first intermediate connection layer 40 is provided between the first organic emitting layer 30 and the second organic emitting layer 32, and the second intermediate connection layer 42 is provided between the second organic emitting layer 32 and the third organic emitting layer 34. The light emitted by the organic emitting layers 30, 32 and 34 are outcoupled from the supporting substrate 10 through the transparent anode 20.

Figure 2:
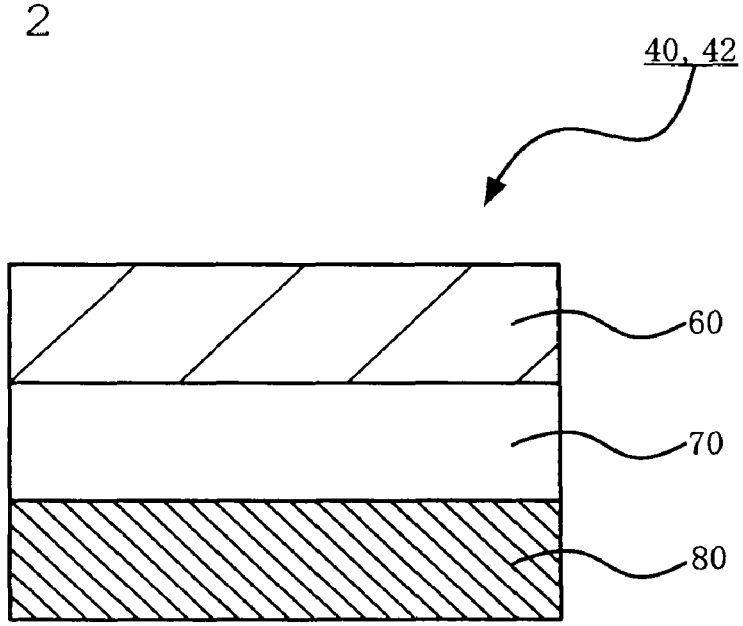
FIG. 2 is a view showing an intermediate connection layer of the organic EL device shown in FIG. 1.

FIG. 2 is a view showing the intermediate connection layers 40 and 42 of the invention. As shown in FIG. 2, the intermediate connection layers 40 and 42 each have a configuration in which an acceptor layer 60, a donor layer 70 and an electron-transporting material layer 80 containing a non-complex compound which contains a nitrogen-containing heterocyclic structure are stacked from the cathode 50 in this order.

In the invention, the acceptor layer 60 is a layer which withdraws electrons (accepts electrons) from the adjacent organic emitting layer and transfers the electrons to the donor layer. The donor layer 70 is a layer which receives electrons from the acceptor layer and injects the electrons (donates electrons) to the electron-transporting material layer. The electron-transporting material layer 80 is a layer which injects electrons to the adjacent organic emitting layer.

The first organic emitting layer 30 of the device 1 emits light when holes are injected from the anode 20 and electrons are injected from the electron-transporting material layer of the first intermediate connection layer 40. Electrons are transferred from the acceptor layer to the electron-transporting material layer of the first intermediate connection layer 40 through the donor layer.

The second organic emitting layer 32 emits light when holes are injected from the acceptor layer of the first intermediate connection layer 40 and electrons are injected from the electron-transporting material layer of the second intermediate connection layer 42. Electrons are transferred from the acceptor layer to the electron-transporting material layer 80 of the first intermediate connection layer 40 through the donor layer. Electrons are transferred from the acceptor layer to the electron-transporting material layer of the second intermediate connection layer 42 through the donor layer.

The third organic emitting layer 34 emits light when electrons are injected from the cathode 50 and holes are injected from the acceptor layer of the second intermediate connection layer 42. Electrons are transferred from the acceptor layer to the electron-transporting material layer 80 of the second intermediate connection layer 42 through the donor layer.

According to the invention, the organic EL device can be driven at a low driving voltage since a specific electron-transporting material layer is used as the intermediate connection layer. Therefore, although a stack-type organic EL device obtained by stacking organic emitting layers tends to require a high driving voltage, the organic EL device of the invention can be operated at a low driving voltage with a high degree of efficiency.

In this embodiment, the three organic emitting layers 30, 32 and 34 may be the same or different, and the two intermediate connection layers 40 and 42 may be the same or different.

In this embodiment, although three organic emitting layers are stacked, two or four or more organic emitting layers may be stacked. In this embodiment, every adjacent two organic emitting layers have an intermediate connection layer interposed therebetween. It suffices to provide one intermediate connection layer with a stacked structure shown in FIG. 2 between at least two organic emitting layers. Therefore, if other organic emitting layers are provided, these different organic emitting layers may be in direct contact with each other, or an ordinary intermediate connection layer which does not have the specific stacked configuration as shown in FIG. 2 may be interposed.

In this embodiment, the transparent electrode is an anode. However, the transparent electrode may be a cathode. In addition, the organic EL device of the invention may be either of a top-emission type organic EL device or a bottom-emission type organic EL device. In each of these types, the electrode on the light-outcoupling side is rendered transparent.

Each member constituting the organic EL device of the invention will be explained below.

1. Supporting Substrate

A supporting substrate is a member for supporting an organic EL device. The substrate is thus desired to be excellent in mechanical strength and dimension stability. As specific examples of the substrate, a glass plate, a metal plate, a ceramic plate, a plastic plate (e.g., polycarbonate resin, acrylic resin, vinyl chloride resin, polyethylene terephthalate resin, polyimide resin, polyester resin, epoxy resin, phenol resin, silicon resin, and fluororesin), and the like can be given.

It is preferable that the supporting substrate formed of such a material be subjected to a moisture-proof treatment or hydrophobic treatment by forming an inorganic film or applying a fluororesin in order to prevent water from entering the organic EL display. In particular, the substrate preferably has a small water content and a gas transmission coefficient to avoid the intermixing of water into an organic luminescent medium. Specifically, it is preferable to adjust the water content of the supporting substrate to 0.0001 wt % or less, and adjust the gas transmission coefficient to $1 \times 10^{-13}$ cc·cm/cm$^2$·sec.cmHg or less.

In the above embodiment, the supporting substrate is preferably transparent with a transmittance for visible light of 50% or more when light is outcoupled through the supporting substrate. However if EL emission is outcoupled through the opposite side, the supporting substrate is not required to be transparent.

2. Anode

As the anode, it is preferable to use metals, alloys, electric conductive compounds and mixtures thereof with a large work function (for example, 4.0 eV or more). Specifically, indium tin oxide (ITO), indium zinc oxide (IZO), indium copper, tin, zinc oxide, gold, platinum, palladium, etc. can be used singly or in a combination of two or more.

The anode can be formed by forming these electrode materials into a thin film by vapor deposition, sputtering or the like. Although there are no specific restrictions on the thickness of the anode, it is preferred that the anode have a thickness of 10 to 1000 nm, more preferably 10 to 200 nm. When light emitting from an organic luminescent medium layer is outcoupled through the anode, the anode is substantially transparent, i.e. has a light transmittance of 50% or more.

3. Cathode

As the cathode, it is preferable to use metals, alloys, electric conductive compounds and mixtures thereof with a small work function (for example, less than 4.0 eV). Specifically, magnesium, aluminum, indium, lithium, sodium, cesium, silver, etc. can be used singly or in a combination of two or more. Although there are no specific restrictions on the thickness of the cathode, it is preferred that the cathode have a thickness of 10 to 1000 nm, more preferably 10 to 200 nm.

4. Organic Emitting Layer

The organic emitting layer includes an organic luminescent medium layer which can give EL emission upon the recombination of electrons and holes. The organic emitting layer may be constructed by stacking the following layers.

(i) Organic luminescent medium layer
(ii) Hole-injecting layer/organic luminescent medium layer
(iii) Organic luminescent medium layer/electron-injecting layer (iv) Hole-injecting layer/organic luminescent medium layer/ electron-injecting/transporting layer
(v) Hole-injecting layer/organic luminescent medium layer/ adhesion-improving layer
Of these, in general, the configuration (iv) is preferably used due to its higher luminance and excellent durability.

The luminescent medium layer of the organic EL device has the following functions (1), (2) and (3) in combination.
(1) Injection function: function of allowing injection of holes from the anode or hole-injecting layer and injection of electrons from the cathode or electron-injecting layer upon application of an electric field
(2) Transporting function: function of moving injected carriers (electrons and holes) due to the force of an electric field
(3) Emitting function: function of providing a site where electrons and holes are recombined to emit light Note that electrons and holes may be injected into the luminescent medium layer with different degrees, or the transportation capabilities indicated by the mobility of holes and electrons may differ. It is preferable that the luminescent medium layer move either electrons or holes.

As the method for forming the luminescent medium layer, a known method such as deposition, spin coating, or an LB method may be applied. It is preferable that the luminescent medium layer be a molecular deposition film. The term "molecular deposition film" refers to a thin film formed by depositing a vapor-phase material compound or a film formed by solidifying a solution-state or liquid-phase material compound. The molecular deposition film is distinguished from a thin film (molecular accumulation film) formed using the LB method by the difference in aggregation structure or higher order structure or the difference in function due to the difference in structure.

As disclosed in JP-A-57-51781, the luminescent medium layer can be formed by dissolving a binder such as a resin and a raw material compound in a solvent to obtain a solution, and forming the solution into a thin film by spin coating or the like.

[Organic Luminescent Medium Layer]

As examples of the emitting material or dopant which may be used for the organic luminescent medium layer, an arylamine compound and/or styryl amine compound, anthracene, naphthalene, phenanthrene, pyrene, tetracene, coronene, chrysene, fluoresceine, perylene, phthaloperylene, naphthaloperylene, perynone, phthaloperynone, naphthaloperynone, diphenylbutadiene, tetraphenylbutadiene, coumarin, oxadiazole, aldazine, bisbenzoxazoline, bisstyryl, pyrazine, cyclopentadiene, quinoline metal complex, aminoquinoline metal complex, benzoquinoline metal complex, imine, diphenylethylene, vinylanthracene, diaminocarbazole, pyrane, thiopyran, polymethine, merocyanine, imidazole chelated oxynoid compound, quinacridone, rubrene, fluorescent dye, and the like can be given. Note that the emitting material or the dopant for the organic luminescent medium layer is not limited thereto.

In the organic EL device of the invention, the luminescent medium layer preferably contains an arylamine compound and/or a styrylamine compound.

As examples of the arylamine compound, a compound of the following formula (A) or the like can be given. As examples of the styrylamine compound, a compound of the following formula (B) or the like can be given.

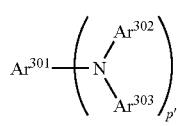
(A)

wherein $Ar^{301}$ is phenyl, biphenyl, terphenyl, stilbene or distyrylaryl; $Ar^{302}$ and $Ar^{303}$ are independently a hydrogen atom or a substituted or unsubstituted aromatic group having 6 to 20 carbon atoms; and p' is an integer of 1 to 4. It is further preferred that the styryl of $Ar^{302}$ and/or $Ar^{303}$ be substituted.

As the aromatic group having 6 to 20 carbon atoms, phenyl, naphthyl, anthracenyl, phenanthryl, terphenyl, and the like are preferable.

(B)

wherein $Ar^{304}$ to $Ar^{306}$ are a substituted or unsubstituted aryl group having 5 to 40 carbon atoms that form a ring (ring carbon atoms); and q' is an integer of 1 to 4.

As the aryl groups having 5 to 40 atoms that form a ring (ring atoms), phenyl, naphthyl, anthracenyl, phenanthryl, pyrenyl, crycenyl, cholonyl, biphenyl, terphenyl, pyrrolyl, furanyl, thiophenyl, benzothiophenyl, oxadiazolyl, diphenylanthracenyl, indolyl, carbazolyl, pyridyl, benzoquinolyl, fluoranthenyl, acenaphthofluoranthenyl, stilbene, and the like are preferable. The aryl group having 5 to 40 ring atoms may be substituted with a substituent. Given as preferred substituents are alkyl groups having 1 to 6 carbon atoms (e.g. ethyl group, methyl group, i-propyl group, n-propyl group, s-butyl group, t-butyl group, pentyl group, hexyl group, cyclopentyl group, and cyclohexyl group), alkoxy groups having 1 to 6 carbon atoms (e.g. ethoxy group, methoxy group, i-propoxy group, n-propoxy group, s-butoxy group, t-butoxy group, pentoxy group, hexyloxy group, cyclopentoxy group, and cyclohexyloxy group), aryl groups having 5 to 40 ring atoms, amino groups substituted with an aryl group having 5 to 40 ring atoms, ester groups containing an aryl group having 5 to 40 ring atoms, ester groups containing an alkyl group having 1 to 6 carbon atoms, cyano group, nitro group, and halogen atoms (e.g. chlorine, bromine and iodine).

As the host material for use in the luminescent medium layer, the compounds represented by the following formulas (1) to (10) are preferred.

Anthracene derivatives represented by the following formula (1):

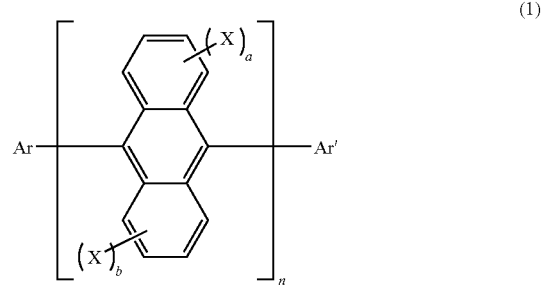
(1)

wherein Ar and Ar' are independently a substituted or unsubstituted aryl group having 5 to 60 ring atoms or a substituted or unsubstituted heteroaryl group having 5 to 60 ring atoms;

X is independently a substituted or unsubstituted aryl group having 6 to 50 ring carbon atoms, a substituted or unsubstituted heteroaryl group having 5 to 50 ring atoms, a substituted or unsubstituted alkyl group having 1 to 50 carbon atoms, a substituted or unsubstituted alkoxy group having 1 to 50 carbon atoms, a substituted or unsubstituted aralkyl group having 6 to 50 carbon atoms, a substituted or unsubstituted aryloxy group having 5 to 50 ring atoms, a substituted or unsubstituted arylthio group having 5 to 50 ring atoms, a substituted or unsubstituted alkoxycarbonyl group having 1 to 50 carbon atoms, a carboxy group, a halogen atom, a cyano group, a nitro group or a hydroxy group;

a and b are each an integer of 0 to 4; and n is an integer of 1 to 3.

Anthracene derivatives represented by the following formula (2):

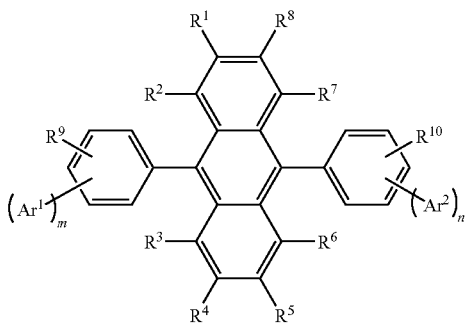

(2)

wherein Ar$^1$ and Ar$^2$ are independently a substituted or unsubstituted aryl group having 6 to 50 ring carbon atoms or a substituted or unsubstituted heteroaryl group having 5 to 60 ring atoms;

m and n are each an integer of 1 to 4;

R$^1$ to R$^{10}$ are independently a hydrogen atom or a substituted or unsubstituted aryl group having 6 to 50 ring carbon atoms, a substituted or unsubstituted heteroaryl group having 5 to 50 ring atoms, a substituted or unsubstituted alkyl group having 1 to 50 carbon atoms, a substituted or unsubstituted cycloalkyl group, a substituted or unsubstituted alkoxy group having 1 to 50 carbon atoms, a substituted or unsubstituted aralkyl group having 6 to 50 carbon atoms, a substituted or unsubstituted aryloxy group having 5 to 50 ring atoms, a substituted or unsubstituted arylthio group having 5 to 50 ring atoms, a substituted or unsubstituted alkoxycarbonyl group having 1 to 50 carbon atoms, a substituted or unsubstituted silyl group, a carboxy group, a halogen atom, a cyano group, a nitro group or a hydroxy group.

Anthracene derivatives represented by the following formula (3):

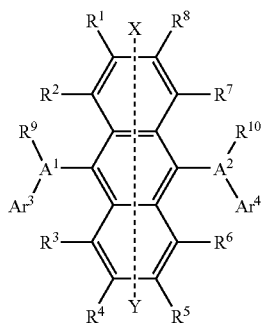

(3)

wherein A$^1$ and A$^2$ are independently a substituted or unsubstituted condensed aromatic ring group having 10 to 20 ring carbon atoms;

Ar$^3$ and Ar$^4$ are independently a hydrogen atom or a substituted or unsubstituted aryl group having 6 to 50 ring carbon atoms;

R$^1$ to R$^{10}$ are independently a hydrogen atom, a substituted or unsubstituted aryl group having 6 to 50 ring carbon atoms, a substituted or unsubstituted heteroaryl group having 5 to 50 ring atoms, a substituted or unsubstituted alkyl group having 1 to 50 carbon atoms, a substituted or unsubstituted cycloalkyl group, a substituted or unsubstituted alkoxy group having 1 to 50 carbon atoms, a substituted or unsubstituted aralkyl group having 6 to 50 carbon atoms, a substituted or unsubstituted aryloxy group having 5 to 50 ring atoms, a substituted or unsubstituted arylthio group having 5 to 50 ring atoms, a substituted or unsubstituted alkoxycarbonyl group having 1 to 50 carbon atoms, a substituted or unsubstituted silyl group, a carboxy group, a halogen atom, a cyano group, a nitro group or a hydroxy group.

Ar$^3$ and Ar$^4$, R$^9$ and R$^{10}$ each may be plural, and adjacent Ar$^3$ and Ar$^4$, R$^9$ and R$^{10}$ may form a saturated or unsaturated cyclic structure.

Anthracene derivatives represented by the following formula (4):

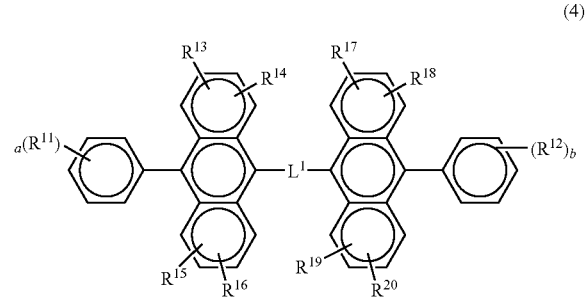

(4)

wherein R$^{11}$ to R$^{20}$ are independently a hydrogen atom, an alkyl group, a cycloalkyl group, a substituted or unsubstituted aryl group, an alkoxy group, an aryloxy group, an alkylamino group, an alkenyl group, an arylamino group or a substituted or unsubstituted heterocyclic group;

a and b are each an integer of 1 to 5, R$^{11}$s and R$^{12}$s may be the same or different if they are two or more, R$^{11}$s and R$^{12}$s may be bonded to each other to form a ring, and R$^{13}$ and R$^{14}$, R$^{15}$ and R$^{16}$, R$^{17}$ and R$^{18}$, and R$^{19}$ and R$^{20}$ may be bonded to each other to form a ring;

L$^1$ is a single bond, —O—, —S—, —N(R)— (R is an alkyl group or a substituted or unsubstituted aryl group), an alkylene group or an arylene group.

Anthracene derivatives represented by the following formula (5):

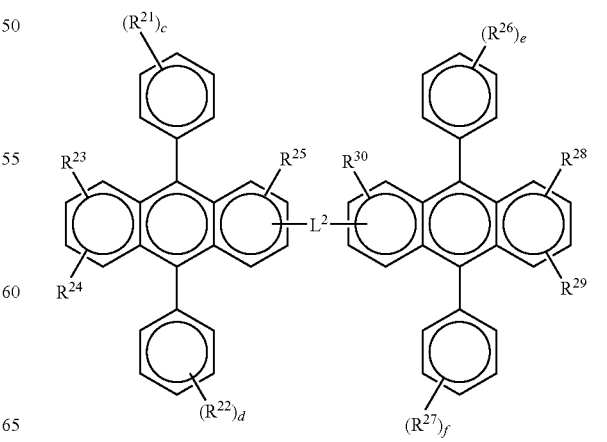

(5)

wherein $R^{21}$ to $R^{30}$ are independently a hydrogen atom, an alkyl group, a cycloalkyl group, an aryl group, an alkoxy group, an aryloxy group, an alkylamino group, an arylamino group or a substituted or unsubstituted heterocyclic group;

c, d, e and f are each an integer of 1 to 5, and when they are two or more, $R^{21}$s, $R^{22}$s, $R^{26}$s or $R^{27}$s may be the same or different, $R^{21}$s, $R^{22}$s, $R^{26}$s or $R^{27}$s may be bonded to form a ring, and $R^{23}$ and $R^{24}$, and $R^{28}$ and $R^{29}$ may be bonded to each other to form a ring;

$L^2$ is a single bond, —O—, —S—, —N(R)— (R is an alkyl group or a substituted or unsubstituted aryl group), an alkylene group or an arylene group).

Anthracene derivatives represented by the following formula (6):

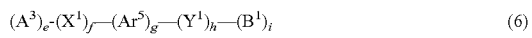

wherein $X^1$ is independently a substituted or unsubstituted pyrene residue;

$A^3$ and $B^1$ are independently a hydrogen atom, a substituted or unsubstituted aromatic hydrocarbon group having 3 to 50 ring carbon atoms, a substituted or unsubstituted aromatic heterocyclic group having 1 to 50 ring carbon atoms, a substituted or unsubstituted alkyl group having 1 to 50 carbon atoms, a substituted or unsubstituted alkylene group having 1 to 50 carbon atoms, a substituted or unsubstituted alkenyl group having 1 to 50 carbon atoms or a substituted or unsubstituted alkenylene group having 1 to 50 carbon atoms;

$Ar^5$ is independently substituted or unsubstituted aromatic hydrocarbon group having 3 to 50 ring carbon atoms or a substituted or unsubstituted aromatic heterocyclic group having 1 to 50 ring carbon atoms;

$Y^1$ is independently a substituted or unsubstituted aryl group;

f is an integer of 1 to 3; e and i are each an integer of 0 to 4; h is an integer of 0 to 3; and g is an integer of 1 to 5.

Anthracene derivatives represented by the following formula (7):

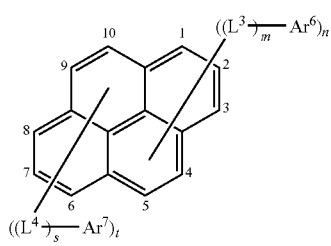

wherein $Ar^6$ and $Ar^7$ are independently a substituted or unsubstituted aryl group having 6 to 50 ring carbon atoms;

$L^3$ and $L^4$ are each a substituted or unsubstituted phenylene group, a substituted or unsubstituted naphthalenylene group, a substituted or unsubstituted fluorenylene group, or a substituted or unsubstituted dibenzosilolylene group;

m is an integer of 0 to 2, n is an integer of 1 to 4, s is an integer of 0 to 2, and t is an integer of 0 to 4; and $L^3$ or $Ar^6$ bonds at any one position of 1 to 5 of the pyrene, and $L^4$ or $Ar^7$ bonds at any one position of 6 to 10 of the pyrene.

Spirofluorene derivatives represented by the following formula (8):

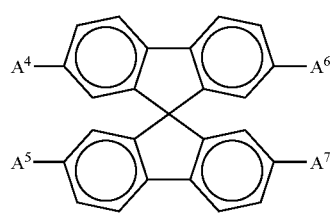

wherein $A^4$ to $A^7$ are independently a substituted or unsubstituted biphenyl group or a substituted or unsubstituted naphthyl group.

Condensed ring-containing compounds represented by the following formula (9):

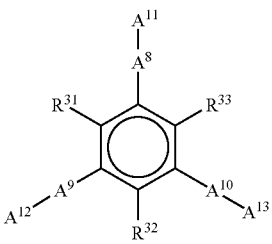

wherein $A^8$ to $A^{13}$ are independently a hydrogen atom, a substituted or unsubstituted aryl group having 6 to 50 ring carbon atoms;

$R^{31}$ to $R^{33}$ are independently a hydrogen atom, alkyl group having 1 to 6 carbon atoms, cycloalkyl group having 3 to 6 carbon atoms, alkoxy group having 1 to 6 carbon atoms, aryloxy group having 5 to 18 carbon atoms, aralkyloxy group having 7 to 18 carbon atoms, arylamino group having 5 to 16 carbon atoms, nitro group, cyano group, ester group having 1 to 6 carbon atoms, or a halogen atom;

provided that at least one of $A^8$ to $A^{13}$ is a group having three or more condensed aromatic rings.

Fluorene compounds represented by the following formula (10)

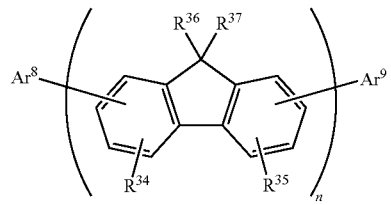

wherein $R^{34}$ and $R^{35}$ are a hydrogen atom, a substituted or unsubstituted alkyl group, substituted or unsubstituted aralkyl group, substituted or unsubstituted aryl group, substituted or unsubstituted heterocyclic group, substituted amino group, cyano group, or a halogen atom. $R^{34}$s or $R^{35}$s bonded to different fluorene groups may be the same or different, and $R^1$ and $R^2$ bonded to a single fluorene group may be the same or different;

$R^{36}$ and $R^{37}$ are a hydrogen atom, a substituted or unsubstituted alkyl group, a substituted or unsubstituted aralkyl group, a substituted or unsubstituted aryl group, or a substituted or unsubstituted heterocyclic group, provided that $R^{36}$s or $R^{37}$s bonded to different fluorene groups may be the same or different, and $R^{36}$ and $R^{37}$ bonded to a single fluorene group may be the same or different;

$Ar^8$ and $Ar^9$ are a substituted or unsubstituted condensed polycyclic aryl group with a total number of benzene rings of three or more or a condensed polycyclic heterocyclic group which is bonded to the fluorene group through substituted or unsubstituted carbon and has a total number of benzene rings and heterocyclic rings of three or more, provided that $Ar^8$ and $Ar^9$ may be the same or different; and n is an integer of 1 to 10.

Among the above compounds, the host material is preferably the anthracene derivative, more preferably the monoanthracene derivative, and particularly preferably the asymmetric anthracene.

Phosphorescent compounds can be used as an emitting material. In the case of phosphorescence emission, it is preferable to use a carbazole ring-containing compound as a host material. A phosphorescent dopant is a compound that can emit light from triplet excitons. The dopant is not limited so long as it can emit light from triplet excitons, but it is preferably a metal complex containing at least one metal selected from the group of Ir, Ru, Pd, Pt, Os and Re.

The compounds containing a carbazole ring, which are a host suitable for phosphorescence emission, is a compound which allows a phosphorescent compound to emit as a result of energy transfer from its excited state to the phosphorescent compound. The host compound is not limited so long as the compound can transfer its excited energy to a phosphorescent compound and it can be selected depending on purposes. The host compound may contain any heterocyclic ring other than a carbazole ring.

Specific examples of the host compounds include carbazole, triazole, oxazole, oxadiazole, imidazole, polyarylalkane, pyrazoline, pyrazolone, phenylenediamine, arylamine, amino-substituted calcone, styrylanthracene, fluorenone, hydrazone, stilbene and silazane derivatives; aromatic tertiary amine, styrylamine, aromatic dimethylidene and porphyrin compounds; anthraquinodimethane, anthrone, diphenylquinone, thiopyrandioxide, carbodiimide, fluorenylidenemethane and distyrylpyrazine derivatives; heterocyclic tetracarboxylic anhydrides such as naphthaleneperylene; phthalocyanine derivatives; metal complexes of 8-quinolinol derivatives; various metal complex polysilane compounds represented by metal complexes having metal-phthalocyanine, benzoxazole or benzothiazole as a ligand; electroconductive high molecular oligomers such as poly(N-vinylcarbazole) derivatives, aniline copolymers, thiophene oligomers and polythiophene; and polymer compounds such as polythiophene, polyphenylene, polyphenylenevinylene and polyfluorene derivatives. The host compounds may be used either singly or in combination of two or more.

Specific compounds shown below can be exemplified.

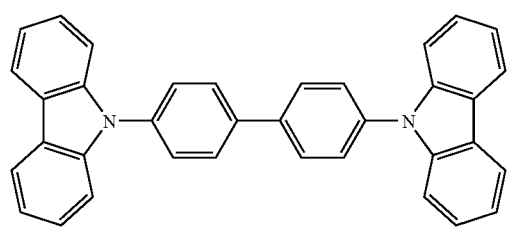

-continued

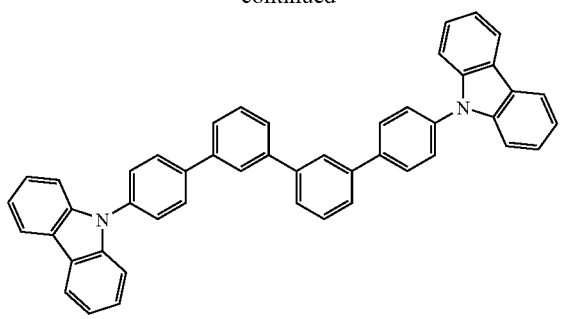

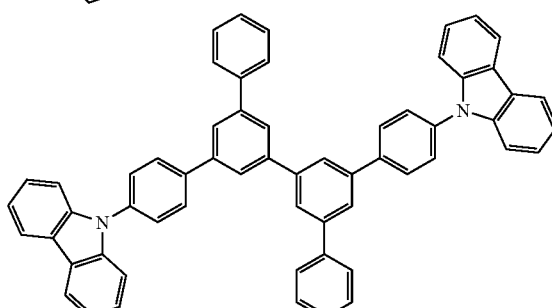

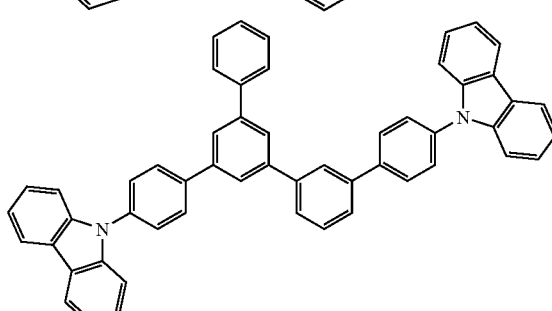

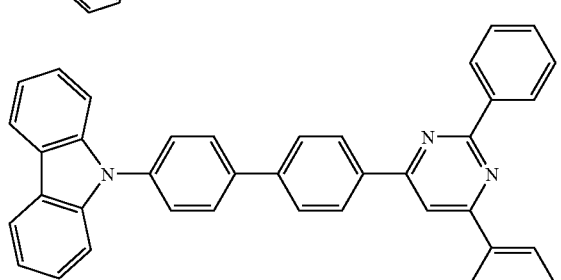

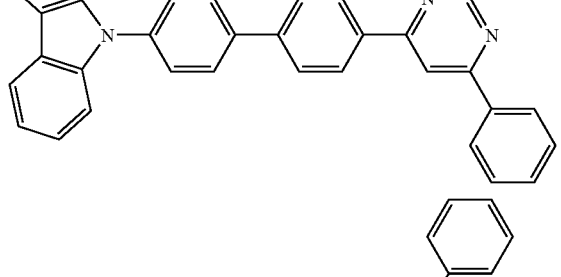

A phosphorescent dopant is a compound that can emit light from triplet excitons. The dopant is not limited so long as it can emit light from triplet excitons, but it is preferably a metal complex containing at least one metal selected from the group of Ir, Ru, Pd, Pt, Os and Re. A porphyrin metal complex or an ortho-metalated metal complex is preferable. As a porphyrin metal complex, a porphyrin platinum complex is preferable. The phosphorescent compounds may be used either singly or in combination of two or more.

There are various ligands forming an ortho-metalated metal complex. Preferable ligands include 2-phenylpyridine, 7,8-benzoquinoline, 2-(2-thienyl)pyridine, 2-(1-naphtyl)pyridine and 2-phenylquinoline derivatives. These derivatives may have substituents, if necessary. Fluorides and derivatives with a trifluoromethyl group introduced are particularly preferable as a blue dopant. As an auxiliary ligand, ligands other than the above-mentioned ligands, such as acetylacetonate and picric acid, may be contained.

The content of a phosphorescent dopant in the luminescent medium layer is not particularly limited and can be properly selected according to purpose; for example, it is 0.1 to 70 mass %, preferably 1 to 30 mass %. When the content of a phosphorescent compound is less than 0.1 mass %, emission may be weak and the advantages thereof may not be sufficiently obtained. When the content exceeds 70 mass %, the phenomenon called concentration quenching may markedly occur, thereby degrading the device performance.

The luminescent medium layer may contain hole-transporting materials, electron-transporting materials and polymer binders, if necessary.

The thickness of a luminescent medium layer is preferably from 5 to 50 nm, more preferably from 7 to 50 nm and most preferably from 10 to 50 nm. When it is less than 5 nm, the formation of a luminescent medium layer and the adjustment of chromaticity may become difficult. When it exceeds 50 nm, the driving voltage may increase.

[Hole-Injecting/Transporting Layer (Hole-Transporting Zone)]

On the anode side of the organic luminescent medium layer, a hole-injecting/transporting layer may be further stacked. The hole-injecting/transporting layer is a layer for helping the injection of holes into the luminescent medium layer to transport the holes to a light-emitting zone. The hole mobility thereof is large and the ionization energy thereof is usually as small as 5.5 eV or less. Such a hole-injecting/transporting layer is preferably made of a material which can transport holes to the luminescent medium layer at a low electric field intensity. The hole mobility thereof is preferably at least $10^{-4}$ cm$^2$/V·second when an electric field of, e.g. $10^4$ to $10^6$ V/cm is applied.

Any materials which have the above preferable properties can be used as the material for forming the hole-injecting/transporting layer without particular limitation. The material for forming the hole-injecting/transporting layer can be arbitrarily selected from materials which have been widely used as a material transporting carriers of holes in photoconductive materials and known materials used in a hole-injecting/transporting layer of organic EL devices.

Specific examples of materials for a hole-injecting/transporting layer, include triazole derivatives (see U.S. Pat. No. 3,112,197 and others), oxadiazole derivatives (see U.S. Pat. No. 3,189,447 and others), imidazole derivatives (see JP-B-37-16096 and others), polyarylalkane derivatives (see U.S. Pat. Nos. 3,615,402, 3,820,989 and 3,542,544, JP-B-45-555 and 51-10983, JP-A-51-93224, 55-17105, 56-4148, 55-108667, 55-156953 and 56-36656, and others), pyrazoline derivatives and pyrazolone derivatives (see U.S. Pat. Nos. 3,180,729 and 4,278,746, JP-A-55-88064, 55-88065, 49-105537, 55-51086, 56-80051, 56-88141, 57-45545, 54-112637 and 55-74546, and others), phenylene diamine derivatives (see U.S. Pat. No. 3,615,404, JP-B-51-10105, 46-3712 and 47-25336, JP-A-54-53435, 54-110536 and 54-119925, and others), arylamine derivatives (see U.S. Pat. Nos. 3,567,450, 3,180,703, 3,240,597, 3,658,520, 4,232,103, 4,175,961 and 4,012,376, JP-B-49-35702 and 39-27577, JP-A-55-144250, 56-119132 and 56-22437, DE1,110,518, and others), amino-substituted chalcone derivatives (see U.S. Pat. No. 3,526,501, and others), oxazole derivatives (ones disclosed in U.S. Pat. No. 3,257,203, and others), styrylanthracene derivatives (see JP-A-56-46234, and others), fluorenone derivatives (JP-A-54-110837, and others), hydrazone derivatives (see U.S. Pat. No. 3,717,462, JP-A-54-59143, 55-52063, 55-52064, 55-46760, 55-85495, 57-11350, 57-148749 and 2-311591, and others), stilbene derivatives (see JP-A-61-210363, 61-228451, 61-14642, 61-72255, 62-47646, 62-36674, 62-10652, 62-30255, 60-93455, 60-94462, 60-174749 and 60-175052, and others), silazane derivatives (U.S. Pat. No. 4,950,950), polysilanes (JP-A-2-204996), aniline copolymers (JP-A-2-282263), and electroconductive high molecular oligomers (in particular thiophene oligomers) disclosed in JP-A-1-211399.

The above-mentioned substances can be used as the material of the hole-injecting/transporting layer. The following can also be used: porphyrin compounds (disclosed in JP-A-63-2956965 and others), aromatic tertiary amine compounds and styrylamine compounds (see U.S. Pat. No. 4,127,412, JP-A-53-27033, 54-58445, 54-149634, 54-64299, 55-79450, 55-144250, 56-119132, 61-295558, 61-98353 and 63-295695, and others), and preferably aromatic tertiary amine compounds.

As the hole-injecting/transporting material to be used in the hole-injecting/transporting layer, the compound represented by the following formula is preferable.

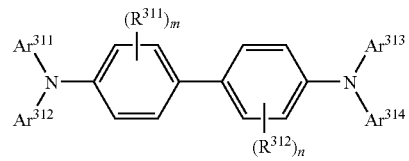

wherein $Ar^{311}$ to $Ar^{314}$ are independently a substituted or unsubstituted aryl group having 6 to 50 ring carbon atoms, $R^{311}$ and $R^{312}$ are independently a hydrogen atom, a substituted and unsubstituted aryl group having 6 to 50 ring carbon atoms or an alkyl group having 1 to 50 carbon atoms; and m and n are an integer of 0 to 4.

Examples of the aryl group having 6 to 50 ring carbon atoms preferably include phenyl, naphthyl, biphenyl, terphenyl and phenanthryl group. The aryl group having 6 to 50 ring carbon atoms may be substituted by a substituent. As preferable examples of the substituent, alkyl groups having 1 to 6 carbon atoms (methyl, ethyl, isopropyl, n-propyl, s-butyl, t-butyl, pentyl, hexyl, cyclopentyl, cyclohexyl and the like) and amino groups substituted by an aryl group having 6 to 50 ring carbon atoms can be given.

The following can also be given as examples: 4,4'-bis(N-(1-naphthyl)-N-phenylamino)biphenyl (hereinafter abbreviated as "NPD"), which has in the molecule thereof two condensed aromatic rings, disclosed in U.S. Pat. No. 5,061,569, and 4,4',4"-tris(N-(3-methylphenyl)-N-phenylamino)triphenylamine (hereinafter abbreviated as "MTDATA"), wherein three triphenylamine units are linked to each other in a starburst form, disclosed in JP-A-4-308688.

In addition to aromatic dimethylidene type compounds mentioned above as the material for a luminescent medium layer, inorganic compounds such as p-type Si and p-type SiC can also be used as the material of the hole-injecting layer/transporting layer.

The hole-injecting/transporting layer can be formed from the above-mentioned compounds by a known method such as vacuum vapor deposition, spin coating, casting or LB technique. The film thickness of the hole-injecting/transporting layer is not particularly limited, and is usually from 5 nm to 5 μm. This hole-injecting/transporting layer may be a single layer made of one or two or more of the above-mentioned materials, or may be stacked hole-injecting/transporting layers made of compounds different from those contained in the above-mentioned hole-injecting/transporting layer, insofar as the hole-transporting zone contains the above-mentioned compounds.

[Electron-Injecting/Transporting Layer (Electron-Transporting Zone)]

An electron-injecting/transporting layer may further be stacked on the cathode side of the organic luminescent medium layer. The electron-injecting/transporting layer is a layer for helping the injection of electrons into the luminescent medium layer, and has a large electron mobility. The thickness of the electron-transporting layer is arbitrarily selected in the range of several nanometers to several micrometers. When the electron-transporting layer has a large thickness, it is preferred that the electron mobility be at least $10^{-5}$ cm$^2$/Vs or more at an applied electric field of $10^4$ to $10^6$ V/cm in order to prevent an increase in voltage.

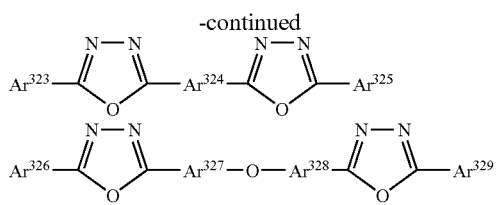

wherein $Ar^{321}$, $Ar^{322}$, $Ar^{323}$, $Ar^{325}$, $Ar^{326}$ and $Ar^{329}$ are independently a substituted or unsubstituted aryl group and may be the same or different. $Ar^{324}$, $Ar^{327}$ and $Ar^{328}$ are independently a substituted or unsubstituted arylene group and may be the same or different.

As examples of the aryl group, a phenyl group, a biphenyl group, an anthranyl group, a perylenyl group, and a pyrenyl group can be given. As examples of the arylene group, a phenylene group, a naphthylene group, a biphenylene group, an anthranylene group, a perylenylene group, a pyrenylene group, and the like can be given. As the substituent, an alkyl group having 1 to 10 carbon atoms, an alkoxy group having 1 to 10 carbon atoms, a cyano group, and the like can be given. The electron-transporting compound is preferably one from which a thin film can be formed.

The following compounds can be given as specific examples of the electron-transporting compound.

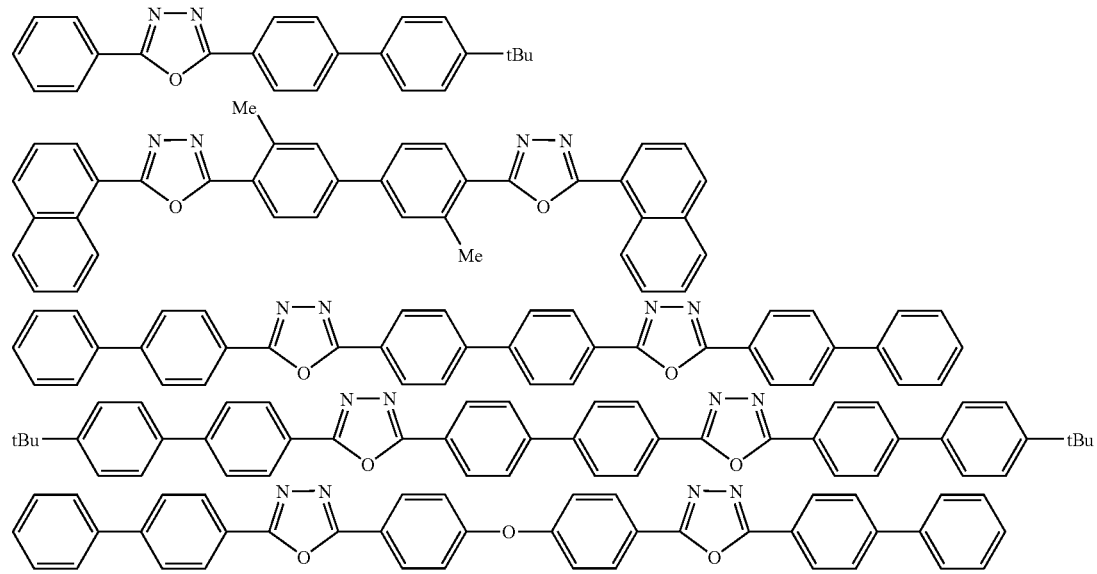

As the material to be used in the electron-injecting/transporting layer, a metal complex of an 8-hydroxyquinoline or 8-hydroxyquinoline derivative, or a compound which contains a nitrogen-containing heterocyclic ring can be given.

As specific examples of a metal complex of an 8-hydroxyquinoline or 8-hydroxyquinoline derivative, metal chelate oxynoid compounds including a chelate of oxine (generally, 8-quinolinol or 8-hydroxyquinoline) can be given. For example, Alq having Al as a central metal can be used in the electron-injecting/transporting layer.

An electron-transporting compound of the following general formula can be given as the oxadiazole derivative.

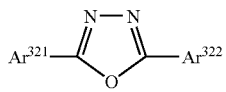

Me is methyl and Bu is butyl.
Nitrogen-containing heterocyclic derivatives represented by the following formula:

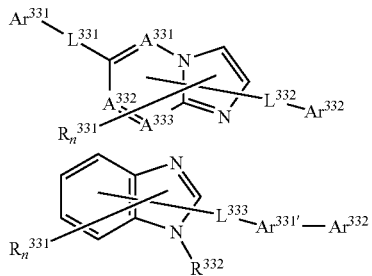

wherein $A^{331}$ to $A^{333}$ are a nitrogen atom or a carbon atom;
$R^{331}$ and $R^{332}$ are each a substituted or unsubstituted aryl group having 6 to 60 carbon atoms, a substituted or unsubstituted heteroaryl group having 3 to 60 carbon atoms, an alkyl group having 1 to 20 carbon atoms, a haloalkyl group having 1 to 20 carbon atoms, or an alkoxy group having 1 to 20 carbon atoms, and n is an integer of 0 to 5, provided that, when n is an integer of 2 or more, $R^{331}$s may be the same or different;

adjacent $R^{331}$s may be bonded to form a substituted or unsubstituted carbocyclic aliphatic ring or a substituted or unsubstituted carbocyclic aromatic ring;

$Ar^{331}$ is a substituted or unsubstituted aryl group having 6 to 60 carbon atoms or a substituted or unsubstituted heteroaryl group having 3 to 60 carbon atoms;

$Ar^{331'}$ is a substituted or unsubstituted arylene group having 6 to 60 carbon atoms or a substituted or unsubstituted heteroarylene group having 3 to 60 carbon atoms;

$Ar^{332}$ is a hydrogen atom, an alkyl group having 1 to 20 carbon atoms, a haloalkyl group having 1 to 20 carbon atoms, an alkoxy group having 1 to 20 carbon atoms, a substituted or unsubstituted aryl group having 6 to 60 carbon atoms, or a substituted or unsubstituted heteroaryl group having 3 to 60 carbon atoms;

provided that one of $Ar^{331}$ and $Ar^{332}$ is a substituted or unsubstituted condensed ring group having 10 to 60 carbon atoms or a substituted or unsubstituted heterocondensed ring group having 3 to 60 carbon atoms; and $L^{331}$, $L^{332}$ and $L^{333}$ are independently a single bond, a substituted or unsubstituted condensed ring having 6 to 60 carbon atoms, a substituted or unsubstituted heterocondensed ring having 3 to 60 carbon atoms or a substituted or unsubstituted fluorenylene group.

Nitrogen-containing heterocyclic derivatives of the following formula disclosed in Japanese Patent Application No. 2003-004193:

wherein HAr is a substituted or unsubstituted nitrogen-containing heterocyclic ring having 3 to 40 carbon atoms $L^{341}$ is a single bond, a substituted or unsubstituted arylene group having 6 to 60 carbon atoms, a substituted or unsubstituted heteroarylene group having 3 to 60 carbon atoms or a substituted or unsubstituted fluorenylene group;

$Ar^{341}$ is a substituted or unsubstituted divalent aromatic hydrocarbon group having 6 to 60 carbon atoms; and $Ar^{342}$ is a substituted or unsubstituted aryl group having 6 to 60 carbon atoms or a substituted or unsubstituted heteroaryl group having 3 to 60 carbon atoms.

Silacyclopentadiene derivatives of the following formula disclosed in JP-A-09-087616

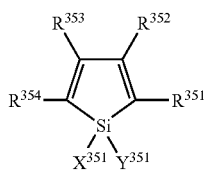

wherein $X^{351}$ and $Y^{351}$ are independently a saturated or unsaturated hydrocarbon group having 1 to 6 carbon atoms, an alkoxy group, an alkenyloxy group, an alkynyloxy group, a hydroxy group, a substituted or unsubstituted aryl group, or a substituted or unsubstituted hetero ring, or $X^{351}$ and $Y^{351}$ are bonded to form a saturated or unsaturated ring, and $R^{351}$ to $R^{354}$ are independently hydrogen, halogen, a substituted or unsubstituted alkyl group having 1 to 6 carbon atoms, an alkoxy group, aryloxy group, perfluoroalkyl group, perfluoroalkoxy group, amino group, alkylcarbonyl group, arylcarbonyl group, alkoxycarbonyl group, aryloxycarbonyl group, azo group, alkylcarbonyloxy group, arylcarbonyloxy group, alkoxycarbonyloxy group, aryloxycarbonyloxy group, sulfinyl group, sulfonyl group, sulfanyl group, silyl group, carbamoyl group, aryl group, heterocyclic group, alkenyl group, alkynyl group, nitro group, formyl group, nitroso group, formyloxy group, isocyano group, cyanate group, isocyanate group, thiocyanate group, isothiocyanate group, or cyano group, or adjacent groups of $R^{351}$ to $R^{354}$ form a substituted or unsubstituted condensed ring.

Silacyclopentadiene derivatives of the following formula disclosed in JP-A-09-194487

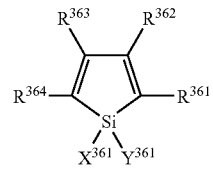

wherein $X^{361}$ and $Y^{361}$ are independently a saturated or unsaturated hydrocarbon group having 1 to 6 carbon atoms, alkoxy group, alkenyloxy group, alkynyloxy group, substituted or unsubstituted aryl group, or substituted or unsubstituted hetero ring, or $X^{361}$ and $Y^{361}$ are bonded to form a saturated or unsaturated ring, and $R^{361}$ to $R^{364}$ are independently hydrogen, halogen, substituted or unsubstituted alkyl group having 1 to 6 carbon atoms, alkoxy group, aryloxy group, perfluoroalkyl group, perfluoroalkoxy group, amino group, alkylcarbonyl group, arylcarbonyl group, alkoxycarbonyl group, aryloxycarbonyl group, azo group, alkylcarbonyloxy group, arylcarbonyloxy group, alkoxycarbonyloxy group, aryloxycarbonyloxy group, sulfinyl group, sulfonyl group, sulfanyl group, silyl group, carbamoyl group, aryl group, heterocyclic group, alkenyl group, alkynyl group, nitro group, formyl group, nitroso group, formyloxy group, isocyano group, cyanate group, isocyanate group, thiocyanate group, isothiocyanate group, or cyano group, or adjacent groups of $R^{361}$ to $R^{364}$ form a substituted or unsubstituted condensed ring, provided that, when $R^{361}$ and $R^{364}$ are phenyl groups, $X^{361}$ and $Y^{361}$ are neither an alkyl group nor a phenyl group, when $R^{361}$ and $R^{364}$ are thienyl groups, a case is excluded in which $X^{361}$ and $Y^{361}$ are monovalent hydrocarbon groups and $R^{362}$ and $R^{363}$ are an alkyl group, an aryl group, an alkenyl group, or $R^{362}$ and $R^{363}$ are aliphatic groups which form a ring by bonding to each other, when $R^{361}$ and $R^{364}$ are silyl groups, $R^{362}$, $R^{363}$, $X^{361}$ and $Y^{361}$ are independently neither a monovalent hydrocarbon group having 1 to 6 carbon atoms nor a hydrogen atom, and when a benzene ring is condensed at the positions of $R^{361}$ and $R^{362}$, $X^{361}$ and $Y^{361}$ are neither an alkyl group nor a phenyl group.

Borane derivatives of the following formula disclosed in JP-T-2000-040586

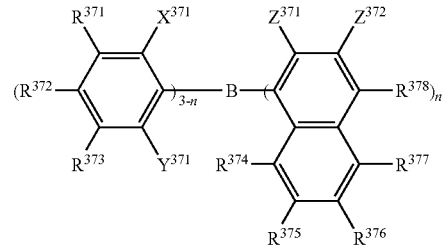

wherein $R^{371}$ to $R^{378}$ and $Z^{372}$ are independently a hydrogen atom, a saturated or unsaturated hydrocarbon group, an aromatic group, a heterocyclic group, a substituted amino group, a substituted boryl group, an alkoxy group, or an aryloxy group, $X^{371}$, $Y^{371}$, and $Z^{371}$ are independently a saturated or unsaturated hydrocarbon group, an aromatic group, a heterocyclic group, a substituted amino group, an alkoxy group, or an aryloxy group, the substituents for $Z^{371}$ and $Z^{372}$ may be bonded to form a condensed ring, n is an integer of 1 to 3, provided that the $Z^{371}$s may differ when n is 2 or more, and a case in which n is 1, $X^{371}$, $Y^{371}$, and $R^{372}$ are methyl groups, and $R^{378}$ is a hydrogen atom or a substituted boryl group, and a case in which n is 3 and $Z^{371}$ is a methyl group are excluded. Compounds of the following formula disclosed in JP-A-10-088121

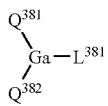

wherein $Q^{381}$ and $Q^{382}$ are independently a ligand of the following formula, $L^{381}$ is a halogen atom, a substituted or unsubstituted alkyl group, a substituted or unsubstituted cycloalkyl group, a substituted or unsubstituted aryl group, a substituted or unsubstituted heterocyclic group, —$OR^{391}$ ($R^{391}$ is a hydrogen atom, a substituted or unsubstituted alkyl group, a substituted or unsubstituted cycloalkyl group, a substituted or unsubstituted aryl group, or a substituted or unsubstituted heterocyclic group), or —O—Ga-$Q^{391}$($Q^{392}$) ($Q^{391}$ and $Q^{392}$ have the same meanings as $Q^{381}$ and $Q^{382}$).

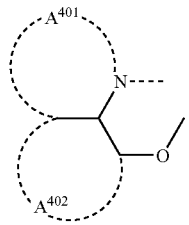

wherein the ring $A^{401}$ and the ring $A^{402}$ are substituted or unsubstituted aryl ring structures or heterocyclic structures which are bonded to each other.

Specific examples of the substituents for the rings $A^{401}$ and $A^{402}$ forming the ligand of the above formula include halogen atoms such as chlorine, bromine, iodine, and fluorine, substituted or unsubstituted alkyl groups such as a methyl group, ethyl group, propyl group, butyl group, sec-butyl group, tert-butyl group, pentyl group, hexyl group, heptyl group, octyl group, stearyl group, and trichloromethyl group, substituted or unsubstituted aryl groups such as a phenyl group, naphthyl group, 3-methylphenyl group, 3-methoxyphenyl group, 3-fluorophenyl group, 3-trichloromethylphenyl group, 3-trifluoromethylphenyl group, and 3-nitrophenyl group, substituted or unsubstituted alkoxy groups such as a methoxy group, n-butoxy group, tert-butoxy group, trichloromethoxy group, trifluoroethoxy group, pentafluoropropoxy group, 2,2,3,3-tetrafluoropropoxy group, 1,1,1,3,3,3-hexafluoro-2-propoxy group, and 6-(perfluoroethyl)hexyloxy group, substituted or unsubstituted aryloxy groups such as a phenoxy group, p-nitrophenoxy group, p-tert-butylphenoxy group, 3-fluorophenoxy group, pentafluorophenyl group, and 3-trifluoromethylphenoxy group, substituted or unsubstituted alkylthio groups such as a methylthio group, ethylthio group, tert-butylthio group, hexylthio group, octylthio group, and trifluoromethylthio group, substituted or unsubstituted arylthio groups such as a phenylthio group, p-nitrophenylthio group, p-tert-butylphenylthio group, 3-fluorophenylthio group, pentafluorophenylthio group, and 3-trifluoromethylphenylthio group, a cyano group, a nitro group, an amino group, mono- or di-substituted amino groups such as a methylamino group, diethylamino group, ethylamino group, diethylamino group, dipropylamino group, dibutylamino group, and diphenylamino group, acylamino groups such as a bis(acetoxymethyl)amino group, bis(acetoxyethyl)amino group, bis(acetoxypropyl)amino group, and bis(acetoxybutyl)amino group, a hydroxy group, a siloxy group, an acyl group, substituted or unsubstituted carbamoyl groups such as a carbamoyl group, methylcarbamoyl group, dimethylcarbamoyl group, ethylcarbamoyl group, diethylcarbamoyl group, propylcarbamoyl group, butylcarbamoyl group, and phenylcarbamoyl group, a carboxylic acid group, a sulfonic acid group, an imide group, cycloalkyl groups such as a cyclopentane group and a cyclohexyl group, aryl groups such as a phenyl group, naphthyl group, biphenyl group, anthranyl group, phenanthryl group, fluorenyl group, and pyrenyl group, heterocyclic groups such as a pyridinyl group, pyrazinyl group, pyrimidinyl group, pyridazinyl group, triazinyl group, indolinyl group, quinolinyl group, acridinyl group, pyrrolidinyl group, dioxanyl group, piperidinyl group, morpholidinyl group, piperazinyl group, carbazolyl group, furanyl group, thiophenyl group, oxazolyl group, oxadiazolyl group, benzooxazolyl group, thiazolyl group, thiadiazolyl group, benzothiazolyl group, triazolyl group, imidazolyl group, and benzimidazolyl group, and the like. The above substituents may be bonded to form a six-membered aryl ring or heterocyclic ring.

A preferred embodiment of the invention is a device containing a reducing dopant in an electron-transporting zone or in an interfacial region between the cathode and the organic layer. The reducing dopant is defined as a substance which can reduce an electron-transferring compound. Accordingly, various substances which have given reducing properties can be used. For example, at least one substance can be preferably used which is selected from the group consisting of alkali metals, alkaline earth metals, rare earth metals, alkali metal oxides, alkali metal halides, alkaline earth metal oxides, alkaline earth metal halides, rare earth metal oxides, rare earth metal halides, alkali metal organic complexes, alkaline earth metal organic complexes, and rare earth metal organic complexes.

More specific examples of the preferred reducing dopants include at least one alkali metal selected from the group consisting of Na (work function: 2.36 eV), K (work function: 2.28 eV), Rb (work function: 2.16 eV) and Cs (work function: 1.95 eV), and at least one alkaline earth metal selected from the group consisting of Ca (work function: 2.9 eV), Sr (work function: 2.0 to 2.5 eV), and Ba (work function: 2.52 eV). Metals having a work function of 2.9 eV or less are particularly preferred. Among these, a more preferable reducing dopant is at least one alkali metal selected from the group consisting of K, Rb and Cs. Even more preferable is Rb or Cs. Most preferable is Cs. These alkali metals are particularly high in reducing ability. Thus, the addition of a relatively small amount thereof to an electron-injecting zone improves the luminance of the organic EL device and makes the lifetime thereof long. As a reducing agent having a work function of 2.9 eV or less, combinations of two or more alkali metals are preferable, particularly combinations including Cs, such as Cs and Na, Cs and K, Cs and Rb, or Cs, Na and K are preferable. The combination containing Cs makes it possible to exhibit the reducing ability efficiently. The luminance of the organic EL device can be improved and the lifetime thereof can be made long by the addition thereof to its electron-injecting zone.

In the invention, an electron-injecting/transporting layer made of an insulator or a semiconductor may further be provided between a cathode and an organic layer. By forming the electron-injecting/transporting layer, a current leakage can be effectively prevented and electron-injecting properties can be improved. As the insulator, at least one metal compound selected from the group consisting of alkali metal calcogenides, alkaline earth metal calcogenides, halides of alkali metals and halides of alkaline earth metals can be preferably used. When the electron-injecting/transporting layer is formed of the alkali metal calcogenide or the like, the injection of electrons can be preferably further improved. Specifically preferable alkali metal calcogenides include $Li_2O$, $LiO$, $Na_2S$, $Na_2Se$ and $NaO$ and preferable alkaline earth metal calcogenides include $CaO$, $BaO$, $SrO$, $BeO$, $BaS$ and $CaSe$. Preferable halides of alkali metals include $LiF$, $NaF$, $KF$, $LiCl$, $KCl$ and $NaCl$. Preferable halides of alkaline earth metals include fluorides such as $CaF_2$, $BaF_2$, $SrF_2$, $MgF_2$ and $BeF_2$ and halides other than fluorides.

Semiconductors forming an electron-injecting/transporting layer include one or combinations of two or more of oxides, nitrides, and oxidized nitrides containing at least one element of Ba, Ca, Sr, Yb, Al, Ga, In, Li, Na, Cd, Mg, Si, Ta, Sb and Zn. An inorganic compound forming an electron-injecting/transporting layer is preferably a microcrystalline or amorphous insulating thin film. When the electron-injecting/transporting layer is formed of the insulating thin films, more uniformed thin film is formed whereby pixel defects such as a dark spot are decreased. Examples of such an inorganic compound include the above-mentioned alkali metal calcogenides, alkaline earth metal calcogenides, halides of alkali metals, and halides of alkaline earth metals.

5. Intermediate Connection Layer

The intermediate connection layer is a stacked body obtained by stacking an acceptor layer, a donor layer and an electron-transporting material layer in this order, and used to connect two emitting layers.

[Acceptor Layer]

An acceptor is an easily-reducible organic compound.

The easiness of reduction of a compound can be measured by a reduction potential. In the invention, in terms of a reduction potential obtained by using a saturated calomel electrode (SCE) as a reference electrode, it is preferable to use a compound having a reduction potential of −0.8V or more, more preferably −0.3V or more. It is particularly preferable to use a compound having a reduction potential larger than that of tetracyanoquinodimethane (TCNQ) (about 0V).

Preferably, an acceptor is an organic compound having an electron-attracting substituent or an electron-deficient ring.

As examples of the electron-attracting substituent, halogen, CN—, carbonyl group, aryl boron group, and the like can be given.

As examples of the electron-deficient ring, a compound selected from the group consisting of 2-pyridyl, 3-pyridyl, 4-pyridyl, 2-quinolyl, 3-quinolyl, 4-quinolyl, 2-imidazole, 4-imidazole, 3-pyrazole, 4-pyrazole, pyridazine, pyrimidine, pyrazine, cinnoline, phthalazine, quinazoline, quinoxaline, 3-(1,2,4-N)-triazolyl, 5-(1,2,4-N)-triazolyl, 5-tetrazolyl, 4-(1-O,3-N)-oxazole, 5-(1-O,3-N)-oxazole, 4-(1-S,3-N)-thiazole, 5-(1-S,3-N)-thiazole, 2-benzoxazole, 2-benzothiazole, 4-(1,2,3-N)-benzotriazole, and benzimidazole, and the like can be given. Note that the electron-deficient ring is not limited thereto.

Preferred examples of the acceptor include a quinoid derivative, an arylborane derivative, a thiopyrane dioxide derivative and an imide derivative such as a naphthalimide derivative, and a hexaazatriphenylene derivative.

The following compounds are preferable as the quinoid derivative.

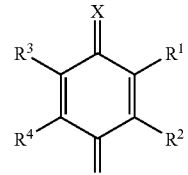

(1a)

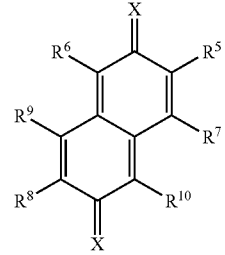

(1b)

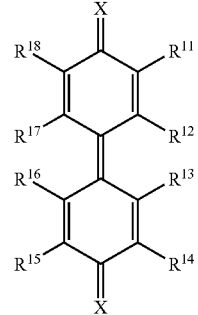

(1c)

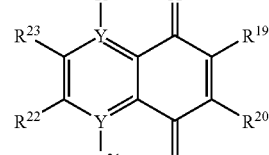

(1d)

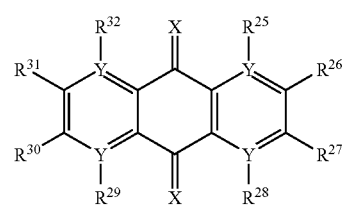

(1e)

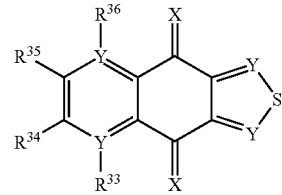

(1f)

-continued

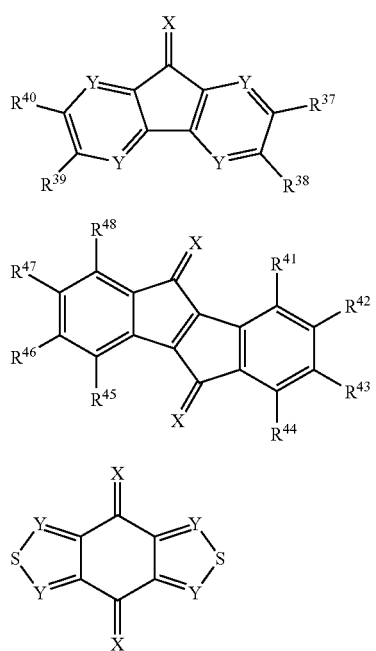

(1g)
(1h)
(1i)

wherein $R^1$ to $R^{48}$ are independently a hydrogen atom, a halogen atom, a fluoroalkyl group, a cyano group, an alkoxy group, an alkyl group, or an aryl group, excluding the case where all of $R^1$ to $R^{48}$ are hydrogen or fluorine in the same molecule; X is an electron-attracting group, and has a structure represented by one of the following structures (j) to (p). The structures of the formulas (j), (k), and (l) are preferable.

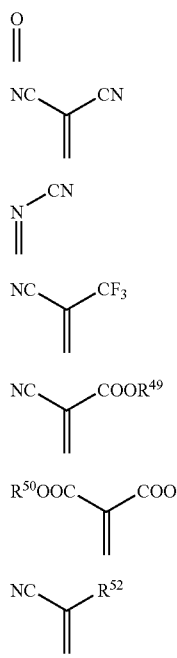

(j)
(k)
(l)
(m)
(n)
(o)
(p)

wherein $R^{49}$ to $R^{52}$ are independently a hydrogen atom, a fluoroalkyl group, an alkyl group, an aryl group, or a heterocyclic ring; $R^{50}$ and $R^{51}$ may form a ring.

Y is =N— or =CH—.

As specific examples of the quinoid derivative, the following compounds can be given.

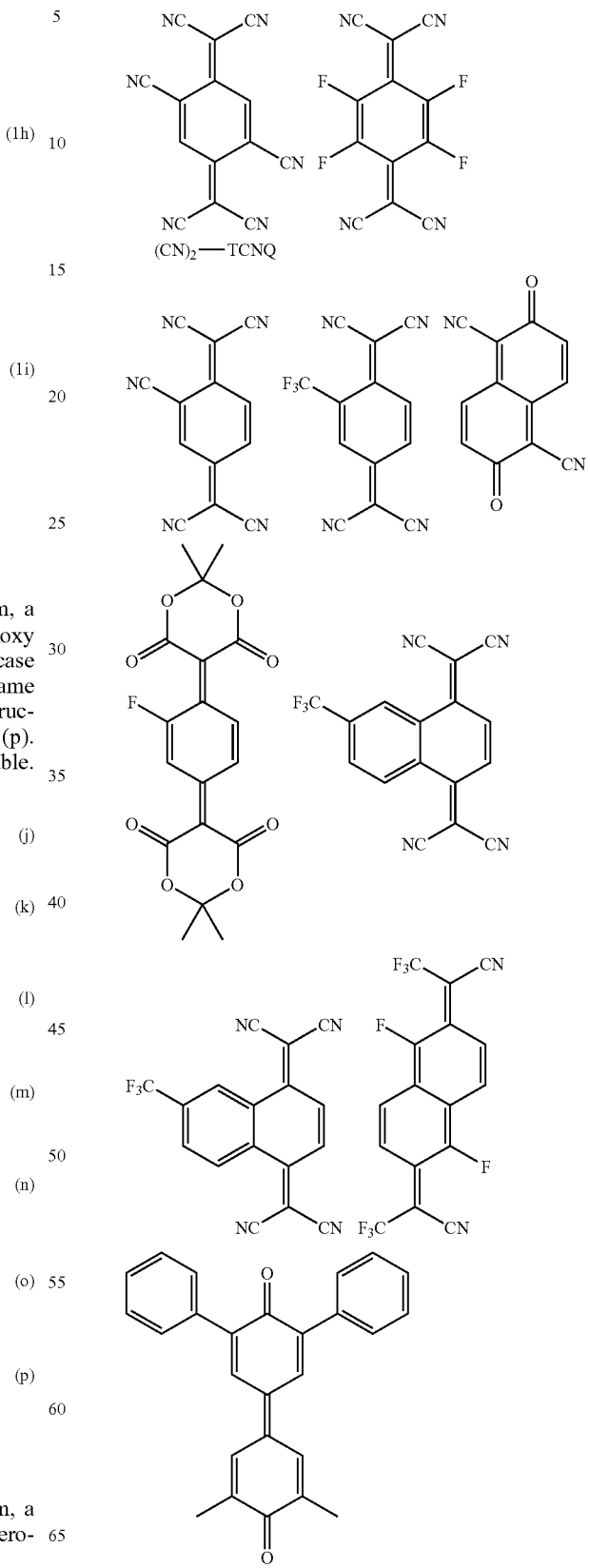

-continued

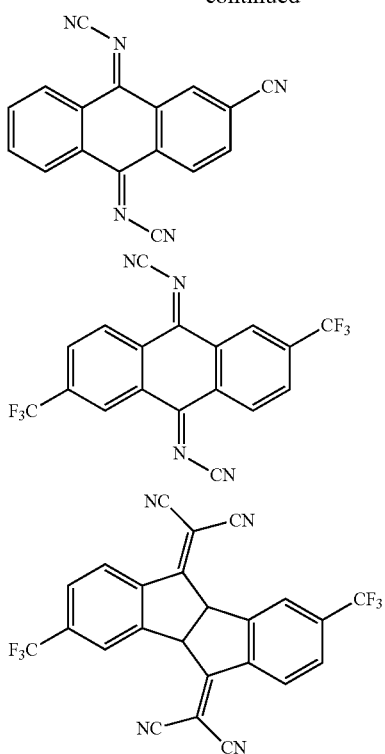

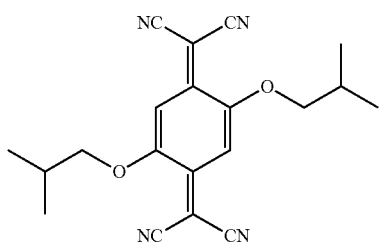

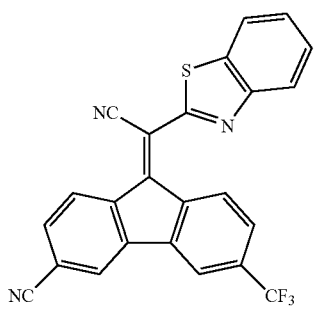

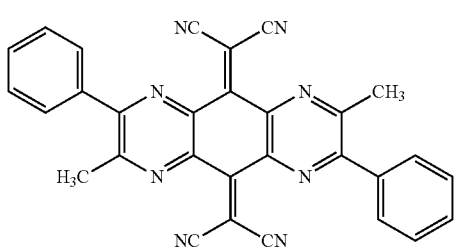

-continued

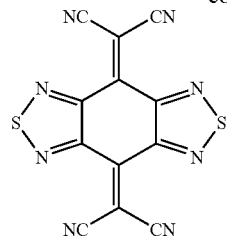

Compounds having the following structure are preferable as the arylborane derivative.

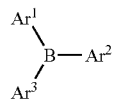  (2a)

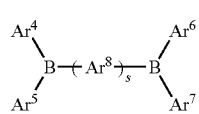  (2b)

wherein $Ar^1$ to $Ar^7$ are independently an aryl group having an electron-attracting group (including a heterocycle); $Ar^8$ is an arylene group having an electron-attracting group; and S is 1 or 2.

Specific examples of the arylborane derivative include the following compounds.

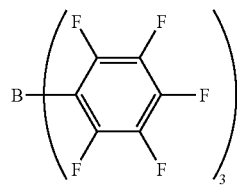

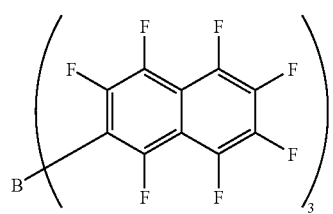

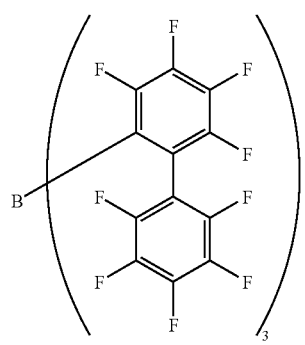

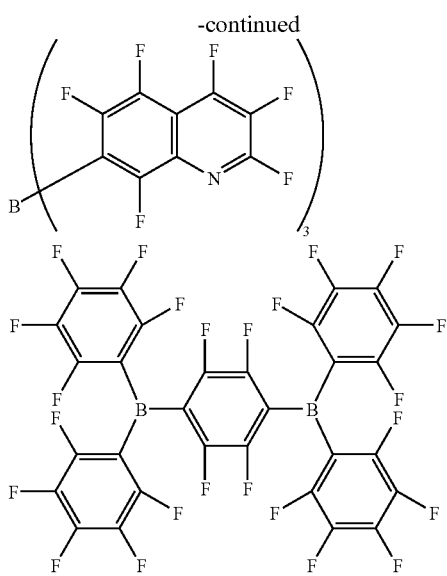

An arylborane compound having at least one fluorine atom as the substituent for the aryl group is particularly preferable. Examples of such a compound include tris-β-(pentafluoronaphthyl)borane(PNB).

Preferred examples of the imide derivative include naphthalene tetracarboxylic diimide compounds and pyromellitic diimide compounds.

Examples of the thiopyranedioxide derivative and the thioxanthene dioxide derivative include the compound (3a) and the compound (3b) which are given below, respectively.

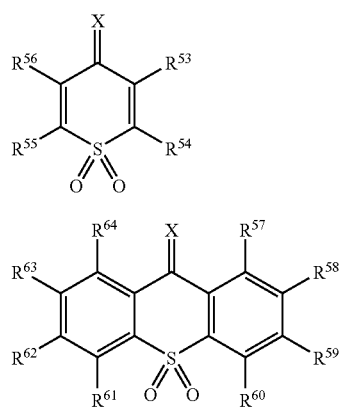

In the formulas 3 (a) and 3 (b), $R^{53}$ to $R^{64}$ are independently hydrogen, halogen, fluoroalkyl, cyano, alkyl or aryl. Preferably, $R^{53}$ to $R^{64}$ are independently hydrogen and cyano.

In the formulas 3(a) and 3(b), X represents an electron-attracting group and is the same as that of X in the formulas (1a) to (1i). The structures of the formulas (j), (k), and (l) are preferable.

The halogen, fluoroalkyl, alkyl and aryl represented by $R^{53}$ to $R^{64}$ are the same as those represented by $R^1$ to $R^{48}$.

Specific examples of the thiopyrane dioxide derivatives represented by the formula (3a) and the thioxanthene dioxide derivatives represented by the formula (3b) are given below.

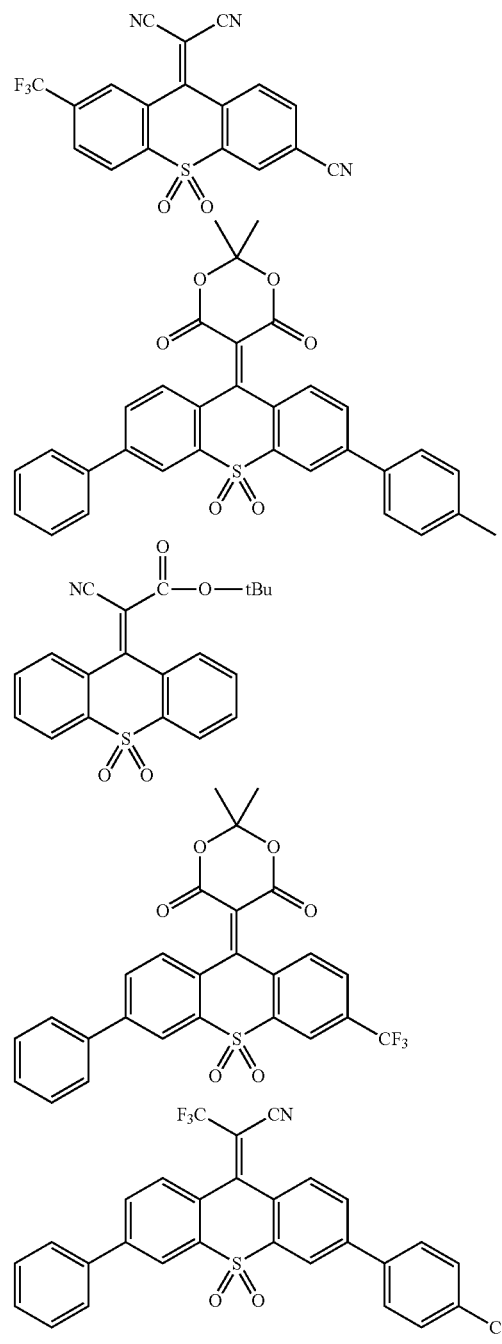

wherein tBu is a tert-butyl group.

In the above formulas (1a) to (1i) and (3a) to (3b), the electron-attracting group X may be a substituent (x) or a substituent (y) represented by the following formulas.

wherein $Ar^9$ and $Ar^{10}$ are a substituted or unsubstituted heterocycle, a substituted or unsubstituted aryloxycarbonyl or aldehyde. Preferably, $Ar^9$ and $Ar^{10}$ are pyridine, pyrazine and quinoxaline. $Ar^9$ and $Ar^{10}$ may be bonded to each other to form a 5- or 6-membered ring.

As the hexaazatriphenylene derivative, the structure given below is particularly preferable. A compound having a cyano group is particularly preferable.

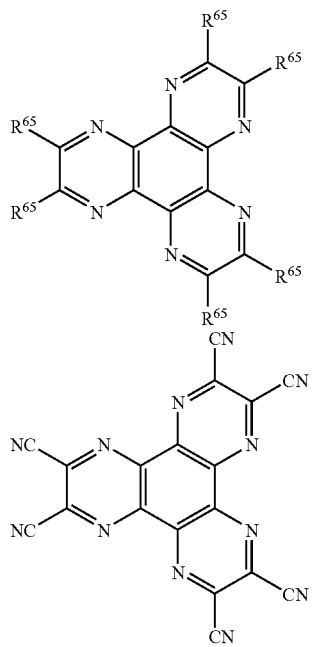

wherein $R^{65}$s are independently cyano, aryloxycarbonyl, alkoxycarbonyl, dialkylcarbamoyl, diarylcarbamoyl, halogen, nitro or carboxy.

It is preferred that the acceptor be capable of being formed into a thin film. Specifically, it is preferred that an acceptor layer be formed by vapor deposition. The expression "capable of being formed into a thin film" means "capable of being formed into a smooth, thin film on a substrate by a common thin film-forming method such as vacuum vapor deposition and spin coating". Here, the "smooth" means a smaller degree of the roughness of the thin film. The surface roughness (Ra) is preferably 10 nm or less, more preferably 1.5 nm or less, still more preferably 1 nm or less. The surface roughness can be measured by means of an atomic force microscope (AFM).

As organic compounds capable of being formed into a thin film, amorphous organic compounds are preferable, with amorphous quinodimethane derivatives being still more preferable. An amorphous quinodimethane derivative having 5 or more CN-groups is further preferable. For example, $(CN)_2$-TCNQ as mentioned above can be given.

The content of an acceptor contained in the acceptor layer is preferably 1 to 100 mole %, more preferably 50 to 100 mole %, relative to the whole layer.

The acceptor layer may contain a hole-transporting and light-transmissive substance in addition to the acceptor. The substance is, however, not limited thereto.

The thickness of the acceptor layer is preferably 1 to 100 nm.

[Donor Layer]

In the organic EL device of the invention, the donor layer is a layer which contains as a donor at least one selected from the group consisting of a donor metal, a donor metal compound and a donor metal complex.

The donor metal is a metal having a work function of 3.8 eV or less. The donor metal is preferably an alkaline metal, an alkaline earth metal and a rare earth metal. More preferably, the donor metal is Cs, Li, Na, Sr, K, Mg, Ca, Ba, Yb, Eu and Ce.

The donor metal compound is a compound which contains the above-mentioned donor metal, preferably a compound which contains an alkali metal, an alkaline earth metal or a rare earth metal, and more preferably a compound containing a halide, an oxide, a carbonate and a borate of these metals. For example, the donor metal compound is a compound represented by $MO_x$, (M is a donor metal, x is 0.5 to 1.5), $MF_x$ (x is 1 to 3) and $M(CO_3)_x$ (x is 0.5 to 1.5).

The donor metal complex is a complex of the above-mentioned donor metal, preferably an organic metal complex of an alkaline metal, an alkaline earth metal or a rare earth metal. Preferably, an organic metal complex represented by the following formula (I):

wherein M is a donor metal, Q is a ligand, preferably an carboxylic acid derivative, a diketone derivative and a quinoline derivative, and n is an integer of 1 to 4.

Specific examples of the donor metal complex include a tungsten paddlewheel disclosed in JP-A-2005-72012. In addition, a phthalocyanine compound having an alkali metal or an alkaline earth metal as a central metal as disclosed in JP-A-11-345687 may be used as a donor metal complex.

The above-mentioned donors may be used singly or in combination of two or more.

The content of a donor contained in the donor layer is 1 to 100 mole %, more preferably 50 to 100 mole %.

In addition to the above-mentioned donor, the donor layer may contain one or a plurality of substances insofar as the substance is light-transmissive. Specific examples of such a substance include, though not limited thereto, organic substances such as an amine compound, a condensed ring compound, a nitrogen-containing heterocyclic compound and a metal complex and inorganic substances such as metal oxides, metal nitrides, metal fluorides and carbonates.

The thickness of the donor layer is preferably 1 to 100 nm.

[Electron-Transporting Material Layer]

A non-complex compound which contains a nitrogen-containing heterocyclic structure is used in the electron-transporting material layer. The compound is preferably a compound which contains a nitrogen-containing five-membered heterocyclic structure. Specifically, the compound represented by the following formula (1) is preferable.

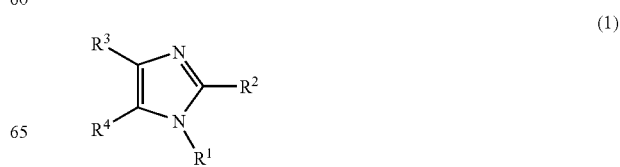

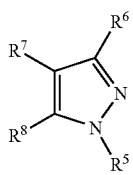

wherein $R^1$ to $R^8$ are independently a hydrogen atom, a substituted or unsubstituted aryl group having 5 to 60 ring atoms, a substituted or unsubstituted heteroaryl group having 5 to 60 ring atoms, a substituted or unsubstituted alkyl group having 1 to 50 carbon atoms, a substituted or unsubstituted cycloalkyl group having 3 to 50 carbon atoms, a substituted or unsubstituted aralkyl group having 6 to 50 ring atoms, a substituted or unsubstituted alkoxy group having 1 to 50 carbon atoms, a substituted or unsubstituted aryloxy group having 5 to 50 ring atoms, a substituted or unsubstituted arylthio group having 5 to 50 ring atoms, a substituted or unsubstituted alkoxycarbonyl group having 1 to 50 carbon atoms, an amino group substituted by a substituted or unsubstituted aryl group having 5 to 50 ring atoms, a halogen atom, a cyano group, a nitro group, a hydroxy group or a carboxy group;

providing that a pair of adjacent substituents $R^1$ to $R^8$ may be bonded to each other to form an aromatic ring or a heterocyclic ring.

In addition, the compound represented by the following formula (2) may be used.

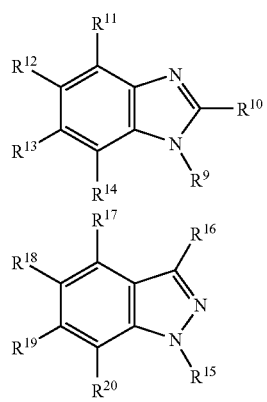

wherein $R^9$ to $R^{20}$ are independently a hydrogen atom, a substituted or unsubstituted aryl group having 5 to 60 ring atoms, a substituted or unsubstituted heteroaryl group having 5 to 60 ring atoms, a substituted or unsubstituted alkyl group having 1 to 50 carbon atoms, a substituted or unsubstituted cycloalkyl group having 3 to 50 carbon atoms, a substituted or unsubstituted aralkyl group having 6 to 50 ring atoms, a substituted or unsubstituted alkoxy group having 1 to 50 carbon atoms, a substituted or unsubstituted aryloxy group having 5 to 50 ring atoms, a substituted or unsubstituted arylthio group having 5 to 50 ring atoms, a substituted or unsubstituted alkoxycarbonyl group having 1 to 50 carbon atoms, an amino group substituted by a substituted or unsubstituted aryl group having 5 to 50 ring atoms, a halogen atom, a cyano group, a nitro group, a hydroxy group or a carboxy group, adjacent groups of $R^9$ to $R^{20}$ may be bonded to each other to form an aromatic ring and at least one of $R^9$ to $R^{20}$ is a substituent represented by the following formula:

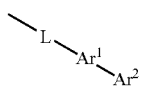

wherein L is a substituted or unsubstituted arylene group having 6 to 60 carbon atoms, a substituted or unsubstituted heteroarylene group having 5 to 60 carbon atoms or a substituted or unsubstituted fluorenylene group;

$Ar^1$ is a substituted or unsubstituted arylene group having 6 to 60 carbon atoms, a substituted or unsubstituted pyridinylene group or a substituted or unsubstituted quinolinylene group;

$Ar^2$ is a hydrogen atom, a substituted or unsubstituted aryl group having 5 to 60 ring atoms, a substituted or unsubstituted pyridyl group, a substituted or unsubstituted quinolyl group, a substituted or unsubstituted alkyl group having 1 to 50 carbon atoms, a substituted or unsubstituted cycloalkyl group having 3 to 50 carbon atoms, a substituted or unsubstituted aralkyl group having 6 to 50 ring atoms, a substituted or unsubstituted alkoxy group having 1 to 50 carbon atoms, a substituted or unsubstituted aryloxy group having 5 to 50 ring atoms, a substituted or unsubstituted arylthio group having 5 to 50 ring atoms, a substituted or unsubstituted alkoxycarbonyl group having 1 to 50 carbon atoms, an amino group substituted by a substituted or unsubstituted aryl group having 5 to 50 ring atoms, a halogen atom, a cyano group, a nitro group, a hydroxy group or a carboxy group.

Specific examples of the compound represented by the above formula (2) are given below.

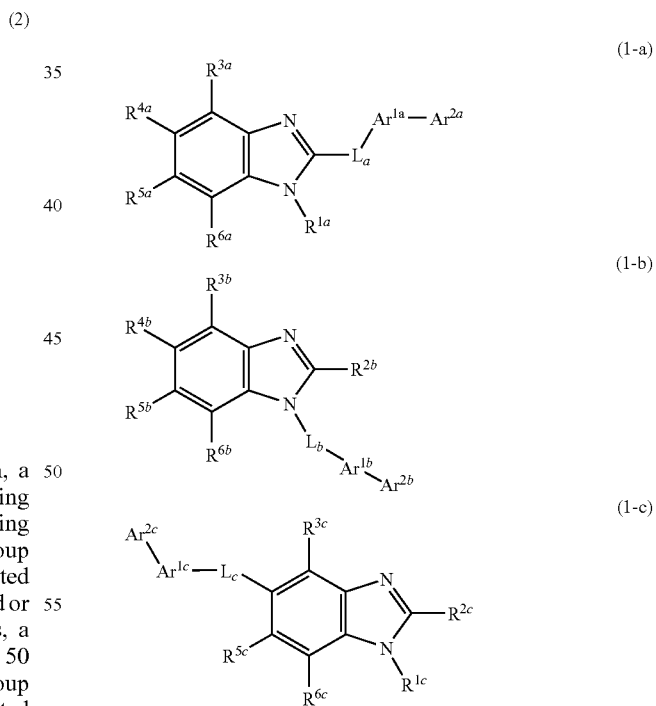

wherein $R^{1a}$ to $R^{5c}$, $L_a$ to $L_c$, and $Ar^{1a}$ to $Ar^{2c}$ are the same as $R^9$ to $R^{20}$, L, $Ar^1$ and $Ar^2$ in the above formula (2).

$L_a$ to $L_c$ and $Ar^{1a}$ to $Ar^{1c}$ are preferably a substituted or unsubstituted phenylene group, a substituted or unsubstituted biphenylene group, a substituted or unsubstituted naphthylene group, a substituted or unsubstituted anthracenylene group or a substituted or unsubstituted pyridylene group.

More preferably, $L_a$ to $L_c$ and $Ar^{1a}$ to $Ar^{1c}$ are a phenylene group, a phenylene group substituted by a methyl group, a biphenylene group, a naphthylene group or an anthracenylene group.

$Ar^{2a}$ to $Ar^{2c}$ are preferably a substituted or unsubstituted phenyl group, a substituted or unsubstituted biphenyl group, a substituted or unsubstituted terphenyl group, or a substituted or unsubstituted naphthyl group and a substituted or unsubstituted aryl group having 6 to 20 carbon atoms. More preferably, $Ar^{2a}$ to $Ar^{2c}$ are a phenyl group, a phenyl group substituted by a methyl group, a biphenyl group, a terphenyl group, a naphthyl group or a phenyl group substituted by a naphthyl group.

$R^{1a}$ and $R^{1c}$ are preferably a substituted or unsubstituted alkyl group having 1 to 6 carbon atoms or a substituted or unsubstituted aryl group having 6 to 20 carbon atoms. More preferably, $R^{1a}$ and $R^{1c}$ are a methyl group, an ethyl group, a propyl group, a butyl group, a phenyl group, a phenyl group substituted by a methyl group, a biphenyl group or a naphthyl group.

$R^{2b}$ and $R^{2c}$ are preferably a hydrogen atom, a substituted or unsubstituted alkyl group having 1 to 6 carbon atoms or a substituted or unsubstituted aryl group having 6 to 20 carbon atoms. More preferably, $R^{2b}$ and $R^{2c}$ are a methyl group, an ethyl group, a propyl group, a butyl group, a phenyl group, a phenyl group substituted by a methyl group, a biphenyl group or a naphthyl group.

$R^{3a}$ to $R^{6a}$, $R^{3b}$ to $R^{6b}$ and $R^{3c}$ to $R^{6c}$ are preferably a hydrogen atom, a substituted or unsubstituted alkyl group having 1 to 6 carbon atoms, a substituted or unsubstituted aryl group having 6 to 20 carbon atoms or a cyano group. More preferably, $R^{3a}$ to $R^{6a}$, $R^{3b}$ to $R^{6b}$ and $R^{3c}$ to $R^{6c}$ are a hydrogen atom, a methyl group, a phenyl group, a biphenyl group, a napthyl group, a cyano group or a trifluoromethyl group.

The thickness of the electron-transporting material layer is preferably 0.1 to 100 nm.

[Others]

As mentioned above, at least one of the intermediate connection layers of the invention is a stacked body of an accetor layer/a donor layer/an electron-transporting material layer. Other intermediate connection layers may be a known intermediate connection layer. As examples of the material constituting these intermediate connection layers, oxides, nitrides, iodides and borides of a metal such as In, Sn, Zn, Ti, Zr, Hf, V, Mo, Cu, Ga, Sr, La and Ru can be given. In addition, multicomponent metal compounds composed of a plurality of these metals can also be given. Specific examples thereof include transparent conductive materials such as ITO, IZO, $SnO_x$, $ZnO_x$, TiN, ZrN, HfN, $TiO_x$, $VO_x$, $MoO_x$, CuI, InN, GaN, $CuAlO_2$, $CuGaO_2$, $SrCu_2O_2$, $LaB_6$ and RuOx. Of these, conductive metal oxides such as ITO, IZO, $SnO_x$, $ZnO_x$, $TiO_x$, $VO_x$, $MoO_x$ and $Ru_x$ can be used preferably.

In order to improve the viewing angle characteristics or other properties of an emitting device, a film containing a low-refractive-index material and the above-mentioned transparent conductive material may be used. As the low-refractive-index material, inorganic compounds including metal oxides ($SiO_x$), etc and metal halides such as metal fluorides (NaF, LiF, $CaF_2$, $Na_3AlF_6$, $AlF_3$, $MgF_2$, $ThF_4$, $LaF_4$, $NdF_3$, etc) and organic compounds including fluorine-containing resins can be used.

EXAMPLES

The materials for the organic EL device and the organic EL device of the invention will be described in detail with reference to the following Examples, which, however, should not be construed as limiting the scope of the invention.

<Compound>

The materials used in Examples and Comparative Examples are given below.

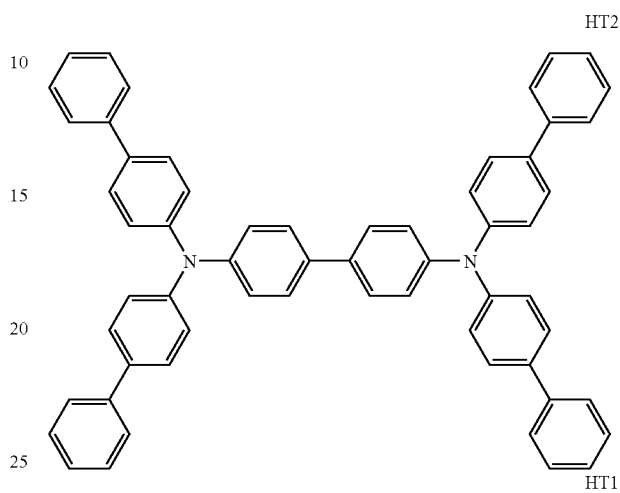

HT2

HT1

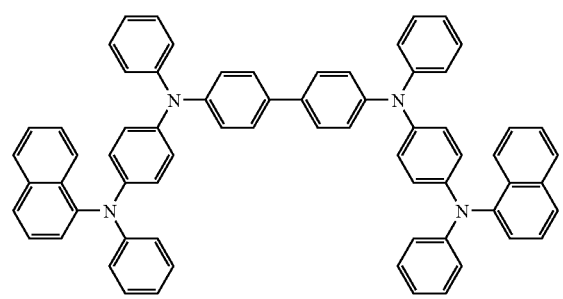

BH

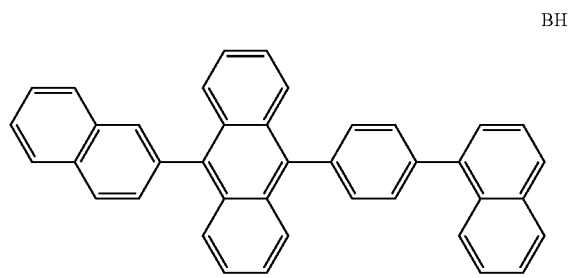

BD1

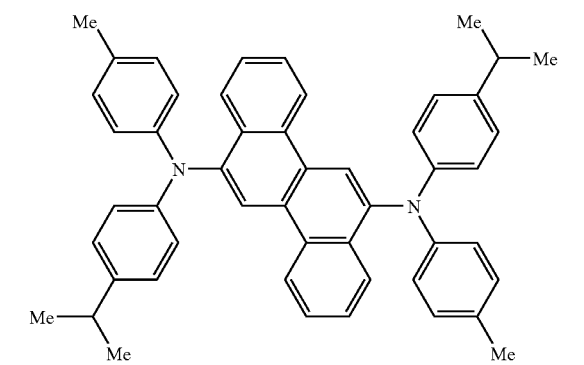

-continued
BD2
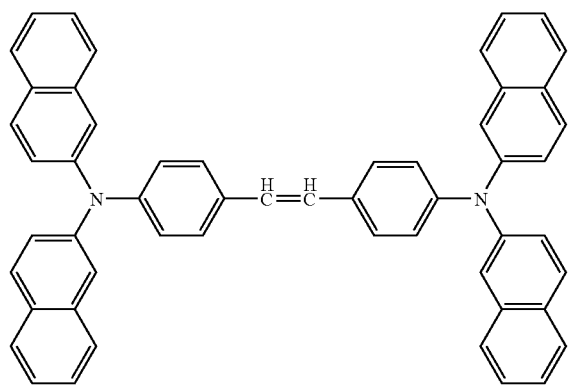
Ac1
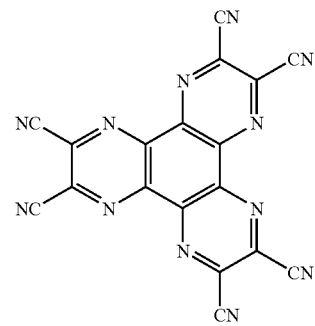
Ac2
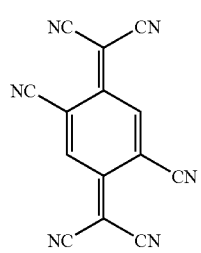
Alq
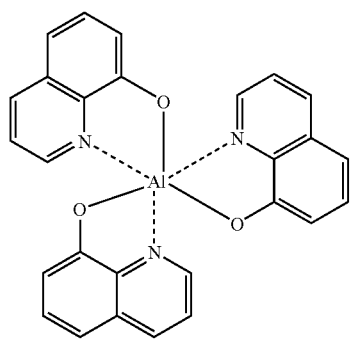
-continued
ET1
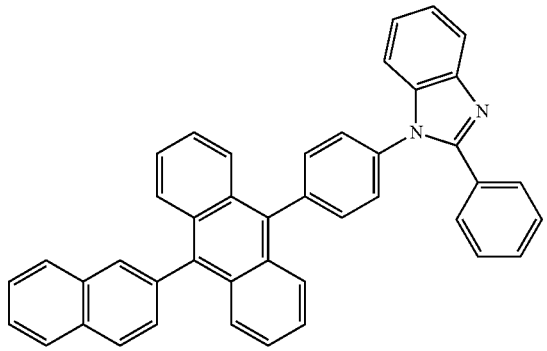
ET2
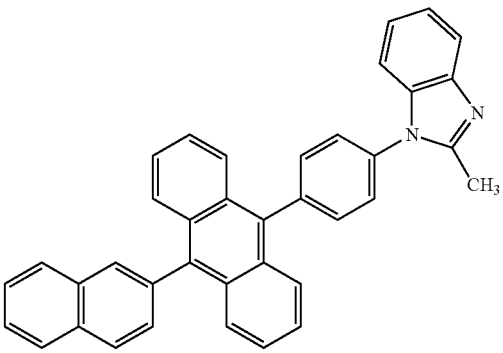
ET3
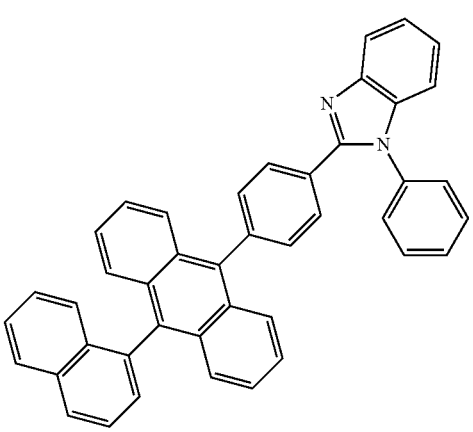
ET4
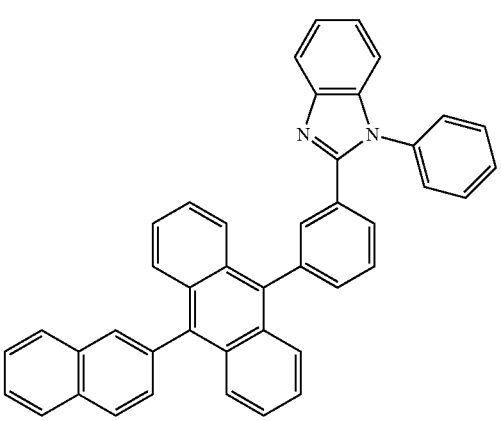

<Reduction Potential of the Material Used in the Acceptor-Containing Layer>

In a cyclic voltammetric measurement using a saturated caramel electrode (SCE) as a reference electrode, the acceptors Ac1 and Ac2 had a reduction potential of −0.07V and 0.71V, respectively.

<Evaluation Method>

(1) Driving Voltage

A voltage (unit: V) which was applied across ITO and Al such that the current density was 10 mA/cm$^2$ was measured.

(2) Luminance Efficiency

Luminance efficiency (unit: cd/A) was calculated from an EL spectrum at the current density of 10 mA/cm$^2$ measured with a spectroradiometer (CS-1000A, manufactured by Konica Minolta Holdings, Inc.).

Example 1

An organic EL device having the following device configuration as the configuration of the anode/the first organic emitting layer/the intermediate connection layer/the second organic emitting layer/the cathode was fabricated. ITO(130)/Ac1(40)/HT1 (40)/BH:BD1(40; 40:2)/ET1(20)/LiF(1.0)/Ac1(40)/HT1(40)/BH:BD1(40; 40:2)/ET1(20)/LiF(1.0)/Al(150)

On a 0.7 mm-thick glass substrate, an ITO film was formed into a thickness of 130 nm by sputtering. Thereafter, the substrate was subjected to ultrasonic cleaning in isopropyl alcohol for 5 minutes, and cleaned with ultraviolet ozone for 30 minutes. Then, the substrate with the ITO electrode was mounted on a substrate holder in a vacuum vapor deposition apparatus.

Ac1 as a material for the hole-injecting layer of the first organic emitting layer and as a material for the acceptor layer of the intermediate connection layer, HT1 as a material for the hole-transporting layer of the first and second organic emitting layers, BH as a host material for the organic luminescent medium layer of the first and second organic emitting layers, BD1 as a blue emitting material, ET1 as an electron-transporting material layer of the intermediate connection layer and as an electron-transporting layer for the second organic emitting layer, LiF as a donor material of the intermediate connection layer and an electron-injecting layer of the second organic emitting layer, and Al as a cathode material were mounted on respective molybdenum heating boats in advance.

First, an Ac1 film which functioned as a hole-injecting layer of the first organic emitting layer was formed in a thickness of 40 nm. Then, an HT1 film which functioned as the hole-transporting layer was formed in a thickness of 40 nm. After the formation of the HT1 film, as an organic luminescent medium layer of the first organic emitting layer, a compound BH and a compound BD1 were co-deposited in an amount ratio of 40:2 in a thickness of 40 nm. On this film, the ET1 film was formed in a thickness of 20 nm as an electron-transporting material layer of the intermediate connection layer. Thereafter, a LiF film was deposited in a thickness of 1 nm as a donor layer, and an Ac1 film was formed in a thickness of 40 nm as an acceptor layer. Then, on the resulting film, an HT1 film which functioned as a hole-transporting layer of the second organic emitting layer was formed in a thickness of 40 nm. After the formation of the HT1 film, a compound BH and a compound BD1 were co-deposited in an amount ratio of 40:2 in a thickness of 40 nm. Furthermore, an ET1 film as the electron transporting material layer was formed in a thickness of 20 nm, and a Lif film as the electron-injecting layer was formed in a thickness of 1 nm. Finally, on the resulting film, an Al film which functioned as a cathode was formed in a thickness of 150 nm, whereby an organic EL device was obtained.

The resulting organic emitting device was evaluated. The results are shown in Table 2.

Example 2

An organic EL device was fabricated in the same manner as in Example 1, except that ET2 was used instead of ET1 in the electron-transporting material layer of the intermediate connection layer and in the electron-transporting layer of the second organic emitting layer.

Example 3

An organic EL device was fabricated in the same manner as in Example 1, except that ET3 was used instead of ET1 in the electron-transporting material layer of the intermediate connection layer and in the electron-transporting layer of the second organic emitting layer.

Example 4

An organic EL device was fabricated in the same manner as in Example 1, except that ET4 was used instead of ET1 in the electron-transporting material layer of the intermediate connection layer and in the electron-transporting layer of the second organic emitting layer.

Comparative Example 1

An organic EL device was fabricated in the same manner as in Example 1, except that Alq was used instead of ET1 in the electron-transporting material layer of the intermediate connection layer and in the electron-transporting material layer of the second organic emitting layer.

Example 5

An organic EL device having the following device configuration as the configuration of the anode/the first organic emitting layer/the intermediate connection layer/the second organic emitting layer/the cathode was fabricated. ITO(130)/Ac2(10)/HT2(50)/HT1(20)/BH:BD2(40; 40:2)/ET1(20)/LiF(1.0)/Ac2(10)/HT2(50)/HT1(20)/BH:BD2(40; 40:2)/ET1(20)/LiF(1.0)/Al(150)

On a 0.7 mm-thick glass substrate, an ITO film was formed into a thickness of 130 nm by sputtering. Thereafter, the substrate was subjected to ultrasonic cleaning in isopropyl alcohol for 5 minutes, and cleaned with ultraviolet ozone for 30 minutes. Then, the substrate with the ITO electrode was mounted on a substrate holder in a vacuum vapor deposition apparatus.

Ac2 as a hole-injecting material of the first organic emitting layer and as a material for the acceptor layer of the intermediate connection layer, HT1 and HT2 as a hole-transporting material of the first and second organic emitting layers, BH as a host material for the organic luminescent medium layer of the first and second organic emitting layers, BD2 as a blue-emitting material, ET1 as an electron-transporting material layer of the intermediate connection layer and as an electron-transporting layer for the second organic emitting layer, LiF as a donor of the intermediate connection layer and an electron-injecting layer of the second organic emitting layer, and Al as a cathode material were mounted on respective molybdenum heating boats in advance.

First, an Ac2 film which functioned as a hole-injecting layer of the first organic emitting layer was formed in a thickness of 10 nm. Then, a stacked film of HT2 and HT1 which functioned as a hole-transporting layer was formed in a thickness of 50 nm of HT2 and 20 nm of HT1. After the formation of the stacked film, as an organic luminescent medium layer of the first emitting layer, a compound BH and a compound BD2 were co-deposited in an amount ratio of 40:2 in a thickness of 40 nm. On the resulting film, an ET1 film was formed in a thickness of 20 nm as an electron-transporting material layer of the intermediate connection layer. Thereafter, a LiF film was deposited in a thickness of 1 nm as a donor layer, and an Ac2 film was formed in a thickness of 10 nm as an acceptor layer. Then, on the resulting film, a stacked film of HT2 and HT1 which functioned as a hole-transporting layer of the second organic emitting layer was formed in a thickness of 50 nm of HT2 and 20 nm of HT1. After the formation of the stacked film, a compound BH and a compound BD2 were co-deposited in an amount ratio of 40:2 in a thickness of 40 nm as an organic luminescent medium layer of the second organic emitting layer. Furthermore, an ET1 film which functioned as an electron-transporting layer of the second organic emitting layer was formed in a thickness of 20 nm, and a LiF film was formed in a thickness of 1 nm as an electron-injecting layer. Finally, an Al film which functioned as a cathode was formed in a thickness of 150 nm, whereby an organic EL device was obtained.

Comparative Example 2

An organic EL device was fabricated in the same manner as in Example 1, except that Alq was used instead of ET1 as the material for an electron-transporting material layer of the intermediate connection layer and as the material for an electron-transporting layer of the second organic emitting layer.

The results of the evaluation are shown in Table 1.

TABLE 1

| | Electron-transporting material layer | CIE-x | CIE-y | L/J (cd/A) | Voltage (V) |
| --- | --- | --- | --- | --- | --- |
| Example 1 | ET1 | 0.13 | 0.23 | 16.1 | 9.1 |
| Example 2 | ET2 | 0.13 | 0.22 | 16.6 | 9.6 |
| Example 3 | ET3 | 0.13 | 0.22 | 14.4 | 12.4 |
| Example 4 | ET4 | 0.13 | 0.22 | 14.5 | 12.8 |
| Com. Ex. 1 | Alq | 0.14 | 0.21 | 13.4 | 13.9 |
| Example 5 | ET1 | 0.14 | 0.20 | 14.2 | 7.6 |
| Com. Ex. 2 | Alq | 0.15 | 0.19 | 11.8 | 12.2 |

As mentioned above, as compared with the case where Alq, which has been conventionally known as the electron-transporting material, was used, by using a non-complex compound which contains a nitrogen-containing heterocyclic structure, the L/J efficiency was improved by 7 to 20% in a similar chromaticity region, and the voltage was decreased by 1 to 4V or more.

INDUSTRIAL APPLICABILITY

The organic EL device of the invention can be used as organic EL materials for various colors including blue. The device can be used in fields such as various display devices, displays, back lights, light sources, signs, signboards, and interior lights, and is especially suitable as a display device for color displays.

The invention claimed is:
1. An organic electroluminescence device comprising:
an anode and a cathode,
at least two organic emitting layers interposed between the anode and the cathode, and
at least one intermediate connection layer provided between the organic emitting layers,
the intermediate connection layer comprising an acceptor layer, a donor layer and an electron-transporting material layer being stacked in this order from the cathode,
the electron-transporting material layer containing a non-complex compound with a nitrogen-containing heterocyclic structure,
wherein:
the acceptor layer comprises a quinoide derivative as an acceptor, and
the donor layer comprises as a donor at least one selected from the group consisting of a donor metal, a donor metal compound, and a donor metal complex.
2. The organic electroluminescence device according to claim 1, wherein the nitrogen-containing heterocyclic structure is a nitrogen-containing five-membered heterocyclic structure.
3. The organic electroluminescence device according to claim 1, wherein the non-complex compound with a nitrogen-containing heterocyclic structure in the electron-transporting material layer is a compound represented by the following formula (1):

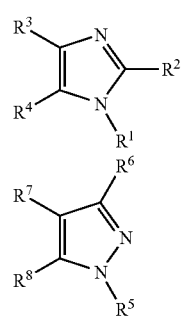

(1)

wherein $R^1$ to $R^8$ are independently a hydrogen atom, a substituted or unsubstituted aryl group having 5 to 60 ring atoms, a substituted or unsubstituted heteroaryl group having 5 to 60 ring atoms, a substituted or unsubstituted alkyl group having 1 to 50 carbon atoms, a substituted or unsubstituted cycloalkyl group having 3 to 50 carbon atoms, a substituted or unsubstituted aralkyl group having 6 to 50 ring atoms, a substituted or unsubstituted alkoxy group having 1 to 50 carbon atoms, a substituted or unsubstituted aryloxy group having 5 to 50 ring atoms, a substituted or unsubstituted arylthio group having 5 to 50 ring atoms, a substituted or unsubstituted alkoxycarbonyl group having 1 to 50 carbon atoms, an amino group substituted by a substituted or unsubstituted aryl group having 5 to 50 ring atoms, a halogen atom, a cyano group, a nitro group, a hydroxy group or a carboxy group; and a pair of adjacent substituents of $R^1$ to $R^8$ may be bonded to each other to form an aromatic ring or a heterocyclic ring.
4. The organic electroluminescence device according to claim 1, wherein the non-complex compound with a nitrogen-containing heterocyclic structure in the electron-transporting material layer is a compound represented by the following formula (2):

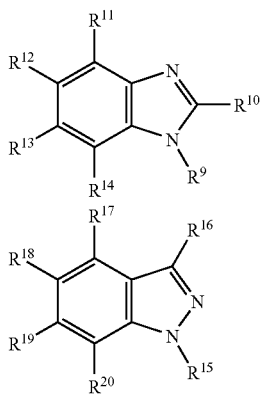
(2)

wherein R⁹ to R²⁰ are independently a hydrogen atom, a substituted or unsubstituted aryl group having 5 to 60 ring atoms, a substituted or unsubstituted heteroaryl group having 5 to 60 ring atoms, a substituted or unsubstituted alkyl group having 1 to 50 carbon atoms, a substituted or unsubstituted cycloalkyl group having 3 to 50 carbon atoms, a substituted or unsubstituted aralkyl group having 6 to 50 ring atoms, a substituted or unsubstituted alkoxy group having 1 to 50 carbon atoms, a substituted or unsubstituted aryloxy group having 5 to 50 ring atoms, a substituted or unsubstituted arylthio group having 5 to 50 ring atoms, a substituted or unsubstituted alkoxycarbonyl group having 1 to 50 carbon atoms, an amino group substituted by a substituted or unsubstituted aryl group having 5 to 50 ring atoms, a halogen atom, a cyano group, a nitro group, a hydroxy group or a carboxy group; adjacent groups of R⁹ to R²⁰ may be bonded to each other to form an aromatic ring, and at least one of R⁹ to R²⁰ is a substituent represented by the following formula:

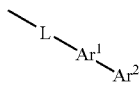

wherein L is a substituted or unsubstituted arylene group having 6 to 60 carbon atoms, a substituted or unsubstituted heteroarylene group having 5 to 60 carbon atoms or a substituted or unsubstituted fluorenylene group;
Ar¹ is a substituted or unsubstituted arylene group having 6 to 60 carbon atoms, a substituted or unsubstituted pyridinylene group or a substituted or unsubstituted quinolinylene group;
Ar² is a hydrogen atom, a substituted or unsubstituted aryl group having 5 to 60 ring atoms, a substituted or unsubstituted pyridyl group, a substituted or unsubstituted quinolyl group, a substituted or unsubstituted alkyl group having 1 to 50 carbon atoms, a substituted or unsubstituted cycloalkyl group having 3 to 50 carbon atoms, a substituted or unsubstituted aralkyl group having 6 to 50 ring atoms, a substituted or unsubstituted alkoxy group having 1 to 50 carbon atoms, a substituted or unsubstituted aryloxy group having 5 to 50 ring atoms, a substituted or unsubstituted arylthio group having 5 to 50 ring atoms, a substituted or unsubstituted alkoxycarbonyl group having 1 to 50 carbon atoms, an amino group substituted by a substituted or unsubstituted aryl group having 5 to 50 ring atoms, a halogen atom, a cyano group, a nitro group, a hydroxy group or a carboxy group.

5. The organic electroluminescence device according to claim 4, wherein the non-complex compound with a nitrogen-containing heterocyclic structure in the electron-transporting material layer is a compound represented by the following formula:

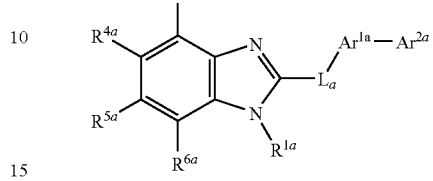

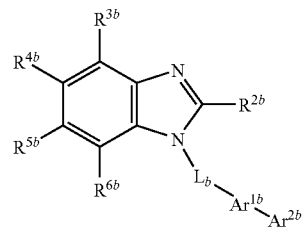

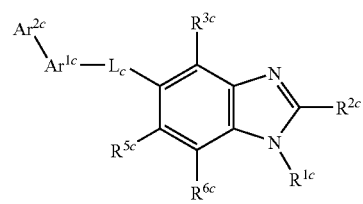

wherein R¹ᵃ to R⁶ᶜ, Lₐ to L꜀ and Ar¹ᵃ to Ar²ᶜ are the same as R⁹ to R²⁰, L, Ar¹ and Ar² in the above formula (2), respectively.

6. The organic electroluminescence device according to claim 1, wherein the donor metal, donor metal compound, and donor metal complex are selected from the group consisting of an alkaline metal, an alkaline earth metal, a rare earth metal, or an oxide of an alkali metal, a halide of an alkali metal, an oxide of an alkaline earth metal, a halide of an alkaline earth metal, an oxide of a rare earth metal, a halide of a rare earth metal, an organic complex of an alkali metal, an organic complex of an alkaline earth metal and an organic complex of a rare earth metal.

7. The organic electroluminescence device according to claim 1, wherein the acceptor in the acceptor layer is a quinoide derivative selected from the group consisting of compounds of formulae (1a)-(1i):

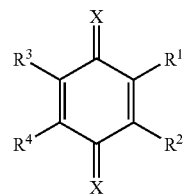
(1a)

-continued

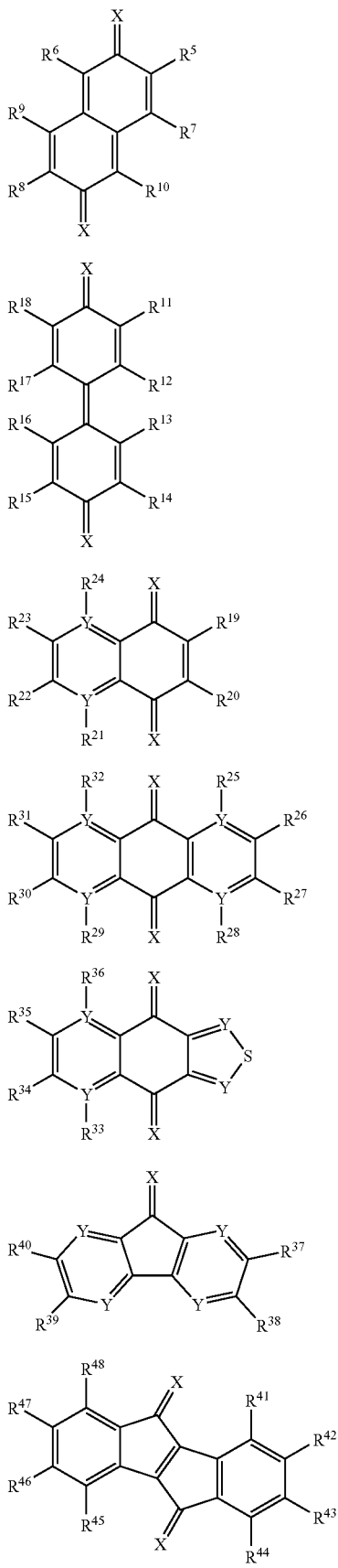

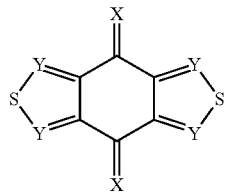

wherein $R^1$ to $R^{48}$ are independently a hydrogen atom, a halogen atom, a fluoroalkyl group, a cyano group, an alkoxy group, an alkyl group, or an aryl group, excluding the case where all of $R^1$ to $R^{48}$ are hydrogen or fluorine in the same molecule; X has a structure represented by one of structures (j) to (p):

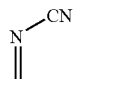

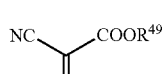

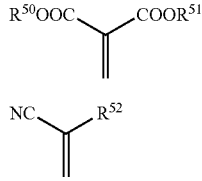

wherein $R^{49}$ to $R^{52}$ are independently a hydrogen atom, a fluoroalkyl group, an alkyl group, an aryl group, or a heterocyclic ring; $R^{50}$ and $R^{51}$ may form a ring; and Y is —N= or —CH=.

8. The organic electroluminescence device according to claim 7, wherein X has a structure represented by one of structures (j), (k), and (l).

9. The organic electroluminescence device according to claim 7, wherein the acceptor in the acceptor layer is a quinoide derivative of formula (1a).

10. The organic electroluminescence device according to claim 7, wherein the acceptor in the acceptor layer is a quinoide derivative of formula (1b).

11. The organic electroluminescence device according to claim 7, wherein the acceptor in the acceptor layer is a quinoide derivative of formula (1c).

12. The organic electroluminescence device according to claim 7, wherein the acceptor in the acceptor layer is a quinoide derivative of formula (1d).

13. The organic electroluminescence device according to claim 7, wherein the acceptor in the acceptor layer is a quinoide derivative of formula (1e).

14. The organic electroluminescence device according to claim 7, wherein the acceptor in the acceptor layer is a quinoide derivative of formula (1f).

15. The organic electroluminescence device according to claim 7, wherein the acceptor in the acceptor layer is a quinoide derivative of formula (1g).

16. The organic electroluminescence device according to claim 7, wherein the acceptor in the acceptor layer is a quinoide derivative of formula (1h).

17. The organic electroluminescence device according to claim 7, wherein the acceptor in the acceptor layer is a quinoide derivative of formula (1i).

18. The organic electroluminescence device according to claim 1, wherein the acceptor in the acceptor layer is a quinoide derivative selected from the group consisting of:

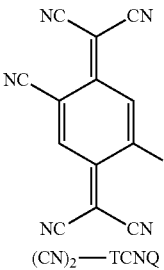
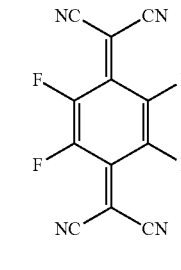
(CN)$_2$—TCNQ
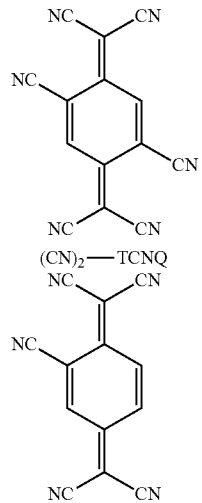
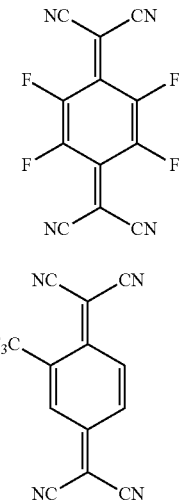
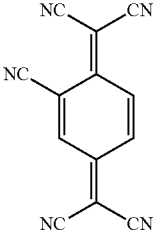
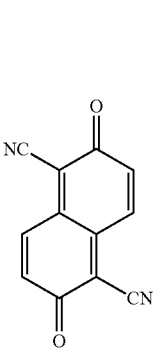
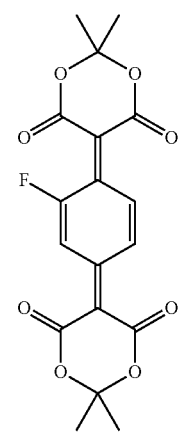
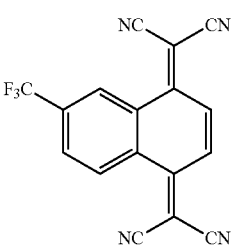
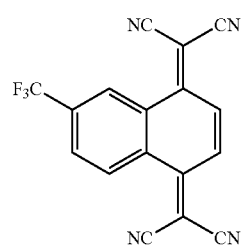

-continued

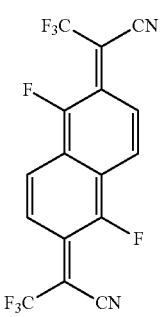
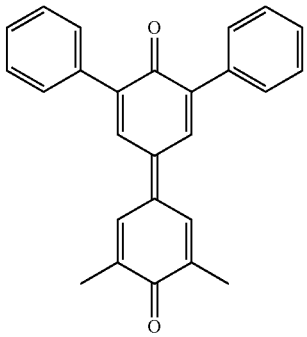
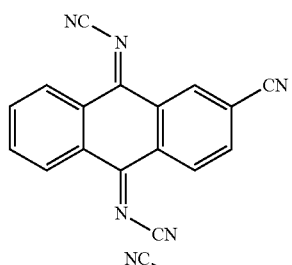
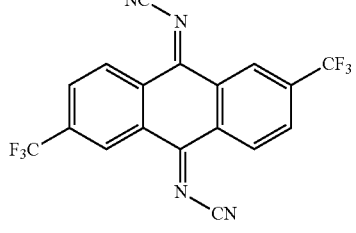
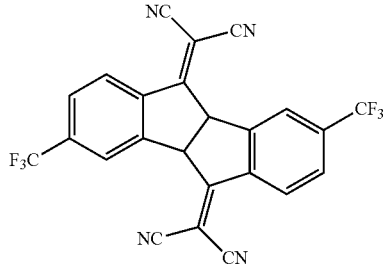
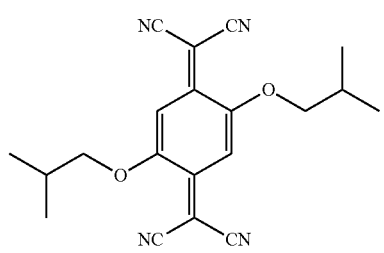
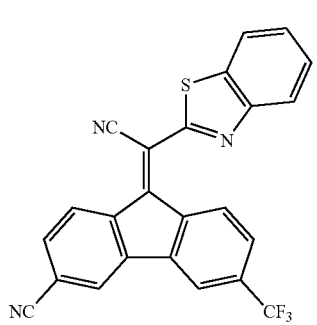

-continued

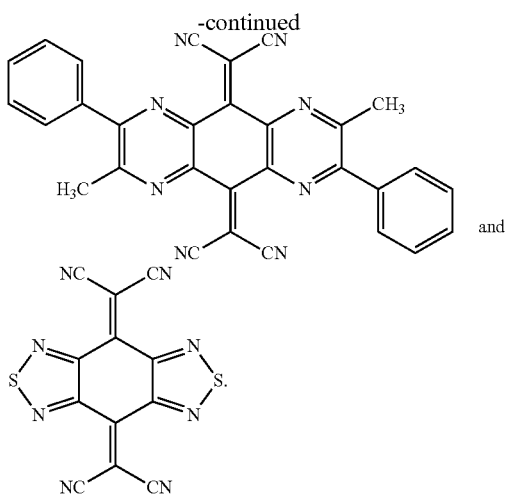

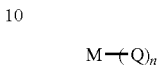 and

19. The organic electroluminescence device according to claim 7, wherein the donor metal is a metal having a work function of 3.8 eV or less, the donor metal compound is a compound represented by $MO_x$ where M is a donor metal and x is 0.5 to 1.5, $MF_x$ where M is a donor metal and x is 1 to 3, or $M(CO_3)_x$ where M is a donor metal and x is 0.5 to 1.5, and the donor metal complex is an organic metal complex represented by the following formula (I):

$$M\text{—}(Q)_n \qquad (I)$$

wherein M is a donor metal, Q is a ligand, and n is an integer of 1 to 4.

20. The organic electroluminescence device according to claim 19, wherein the donor metal is selected form the group consisting of Cs, Li, Na, Sr, K, Mg, Ca, Ba, Yb, Eu and Ce.

* * * * *